(12) United States Patent
Katoh et al.

(10) Patent No.: US 7,692,294 B2
(45) Date of Patent: Apr. 6, 2010

(54) SEMICONDUCTOR DEVICE AND METHOD FOR FABRICATING THE SAME

(75) Inventors: Yoshitsugu Katoh, Kawasaki (JP); Tetsuya Fujisawa, Kawasaki (JP); Mitsutaka Sato, Kawasaki (JP); Eiji Yoshida, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 11/843,948

(22) Filed: Aug. 23, 2007

(65) Prior Publication Data
US 2008/0067672 A1    Mar. 20, 2008

(30) Foreign Application Priority Data
Sep. 14, 2006    (JP)    .............................. 2006-249233

(51) Int. Cl.
*H01L 23/34* (2006.01)
(52) U.S. Cl. ...................................... 257/712; 257/678
(58) Field of Classification Search ................. 257/678, 257/712
See application file for complete search history.

(56) References Cited

U.S. PATENT DOCUMENTS 5,285,350 A * 2/1994 Villaume .................... 361/690

6,498,388 B2 * 12/2002 Kim et al. .................... 257/666

FOREIGN PATENT DOCUMENTS

| JP | 2000294694 A | 10/2000 |
|---|---|---|
| JP | 2005109526 A | 4/2005 |

* cited by examiner

*Primary Examiner*—Douglas M Menz
(74) *Attorney, Agent, or Firm*—Fujitsu Patent Center

(57) ABSTRACT

A semiconductor device with a structure having superior heat sink characteristics. A first heat sink member is located over a wiring board by using an adhesive material. A semiconductor element is stuck over the first heat sink member by using an adhesive material. The semiconductor element and electrodes located over the wiring board are connected by wires. A second heat sink member which covers the semiconductor element and the wires is joined to the first heat sink member by using a conductive adhesive material. The inside and outside of the second heat sink member are sealed by resin except a flat top thereof. By doing so, the semiconductor device is fabricated. Heat which is generated in the semiconductor element and which is transmitted to the first heat sink member is released from an edge portion of the first heat sink member. In addition, the heat which is generated in the semiconductor element and which is transmitted to the first heat sink member is transmitted to the conductive adhesive material and the second heat sink member and is released from the flat top of the second heat sink member.

11 Claims, 40 Drawing Sheets

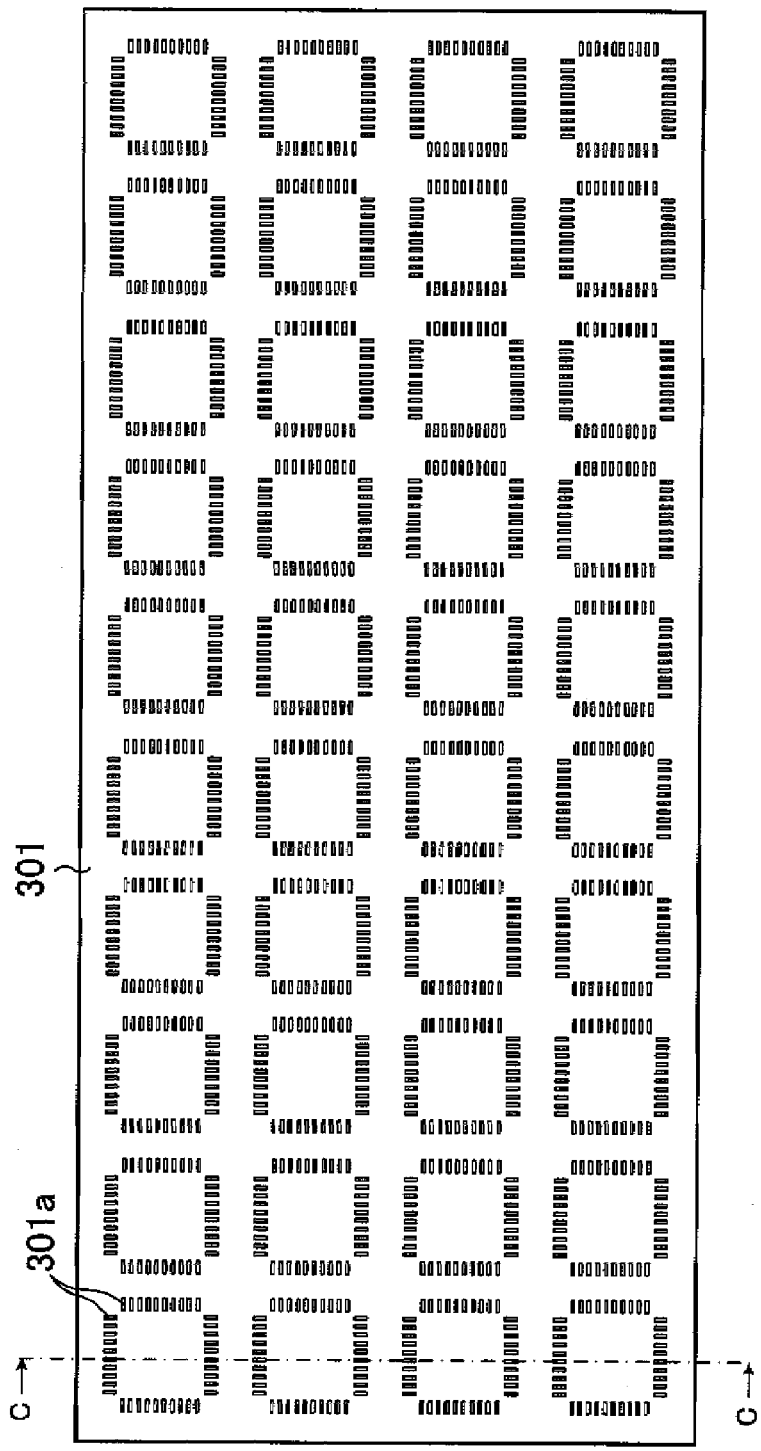
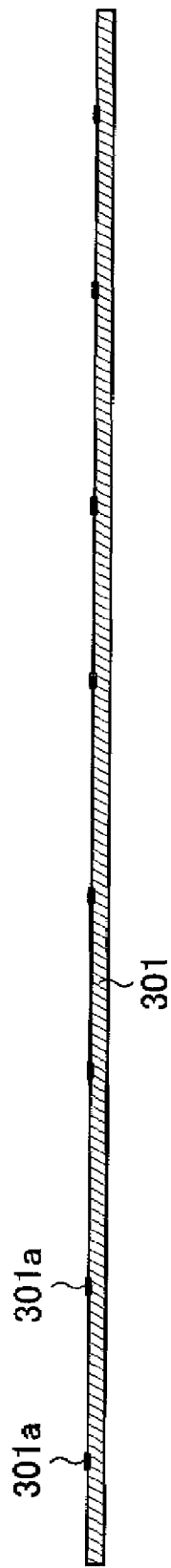
FIG. 31A
FIG. 31B

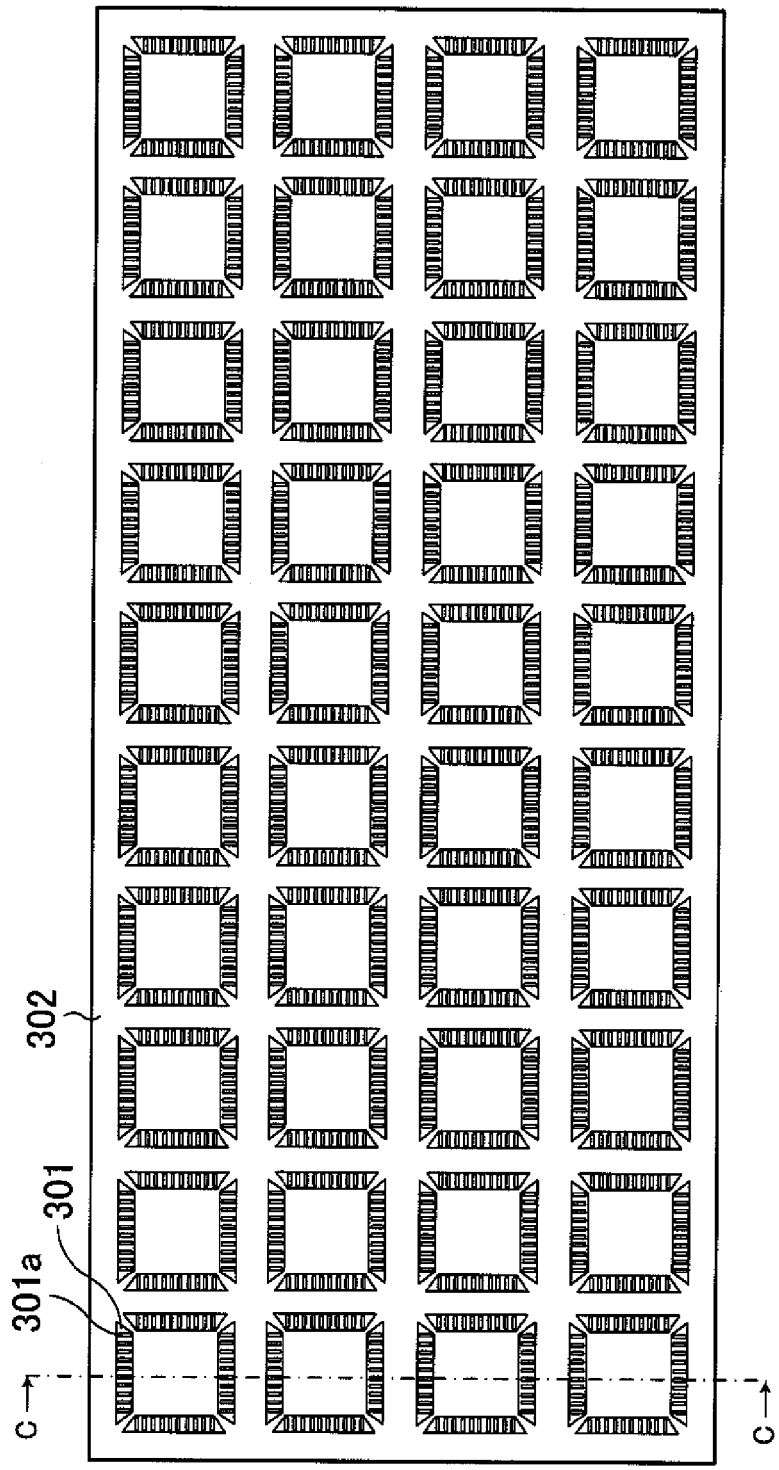
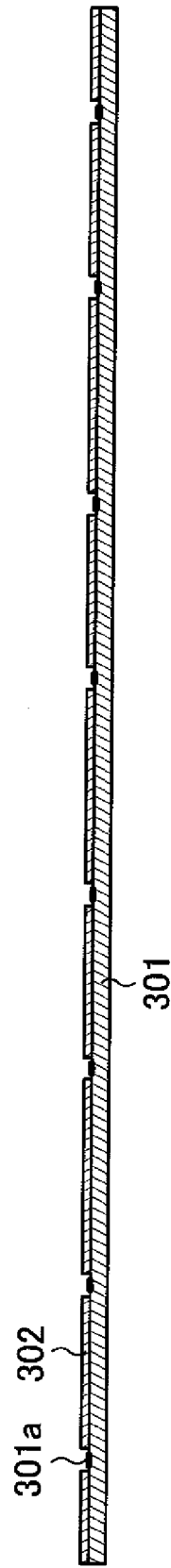
FIG. 32A
FIG. 32B

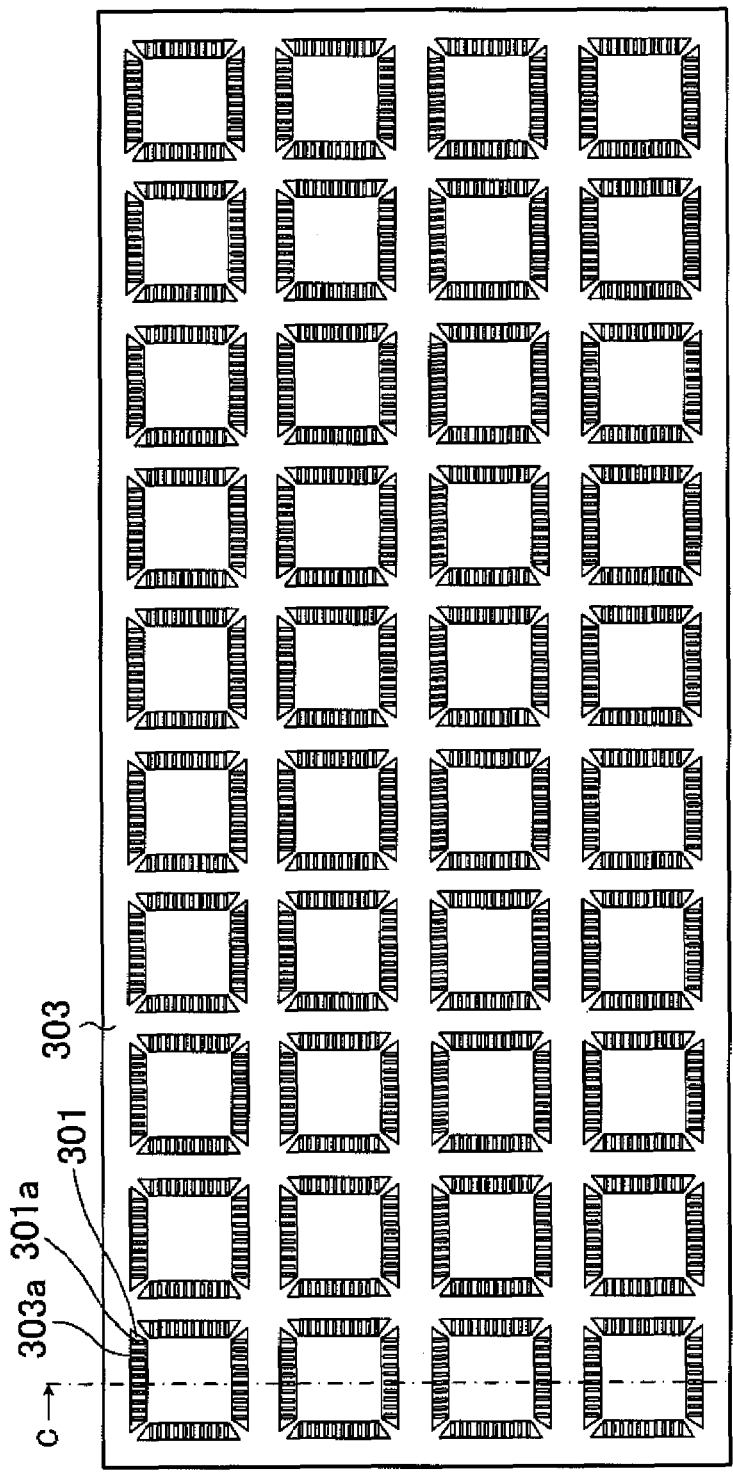
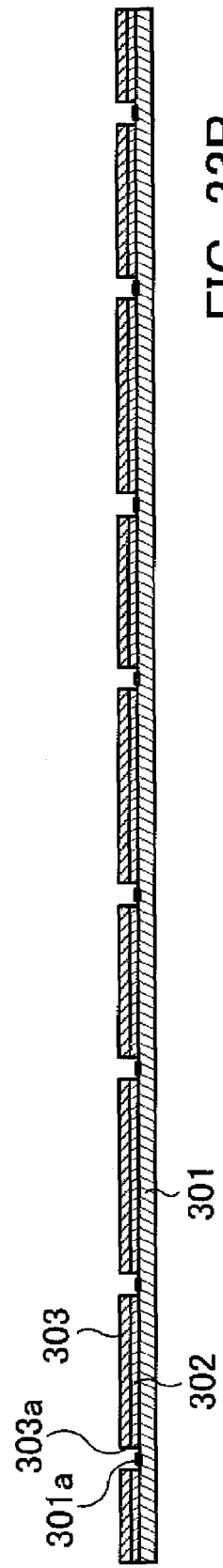
FIG. 33A
FIG. 33B

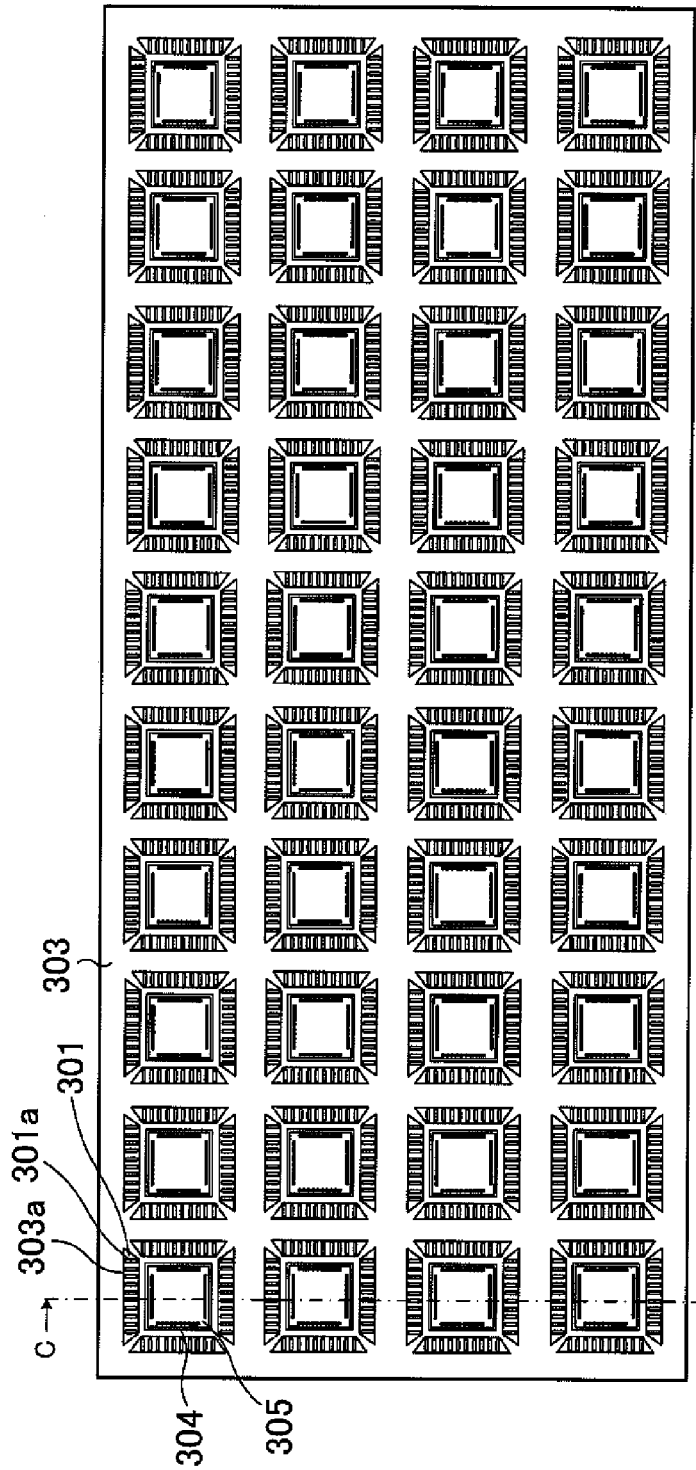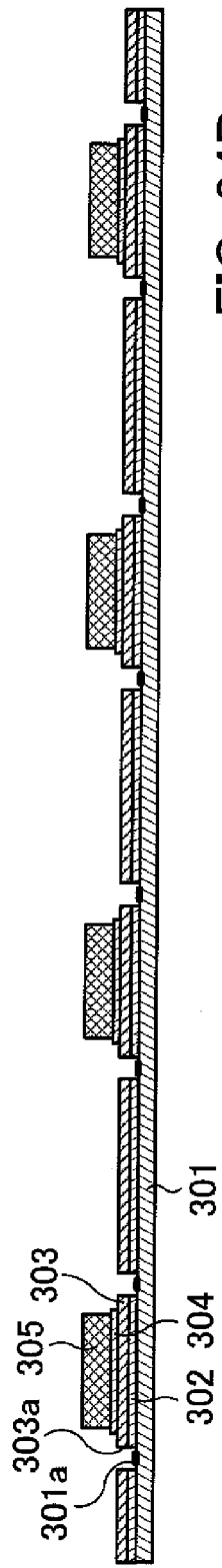
FIG. 34A
FIG. 34B

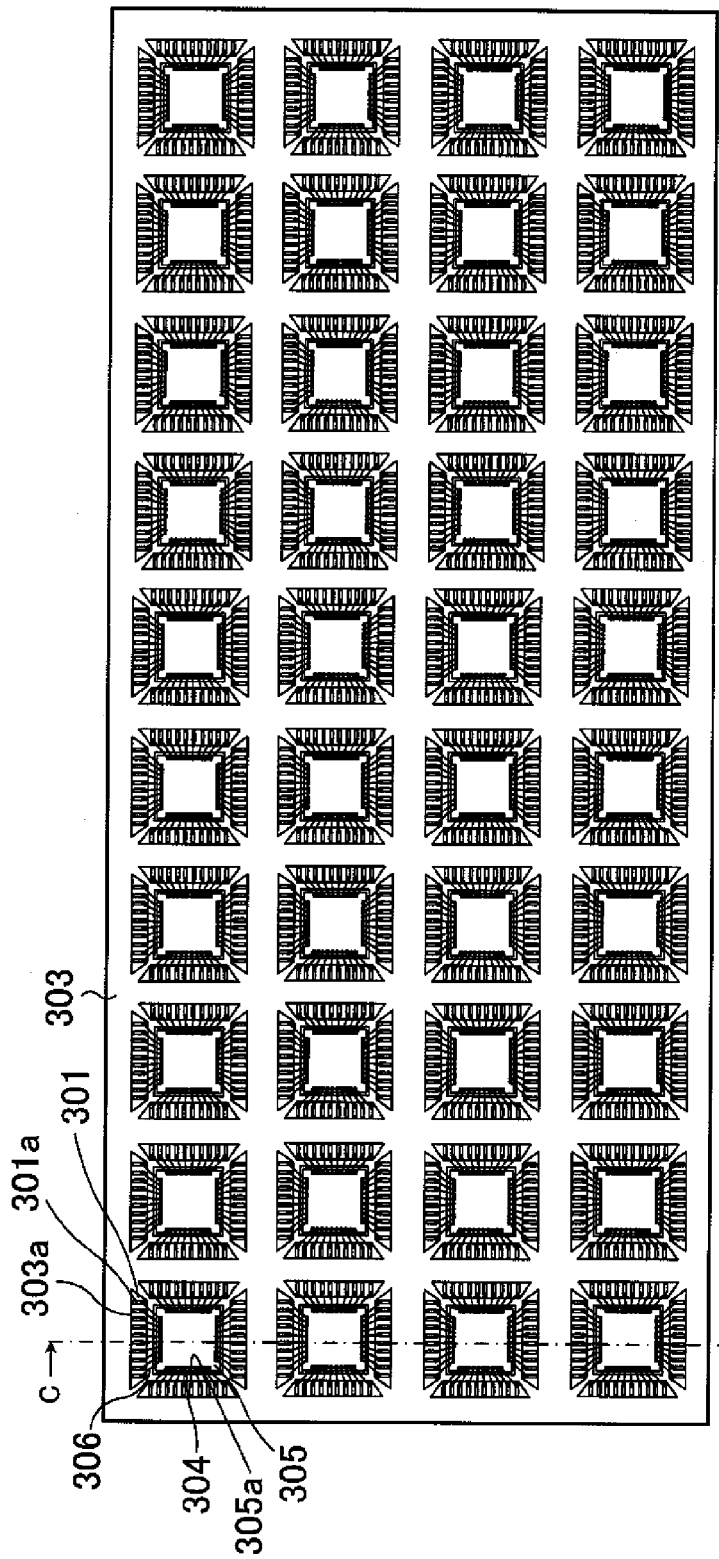
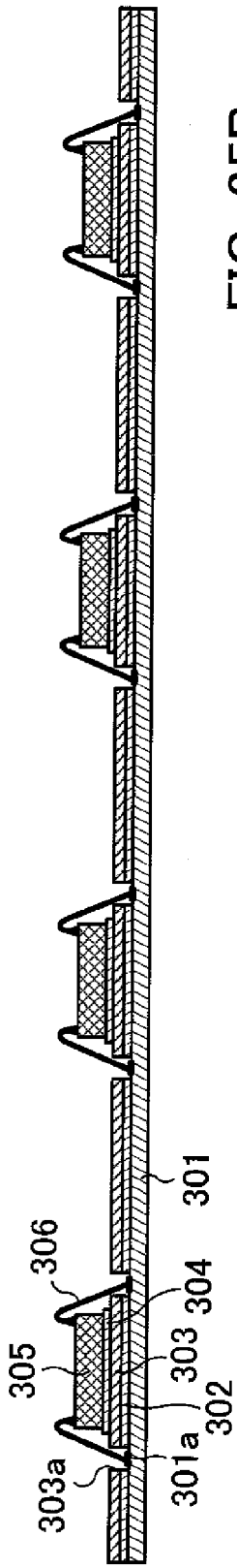
FIG. 35A
FIG. 35B

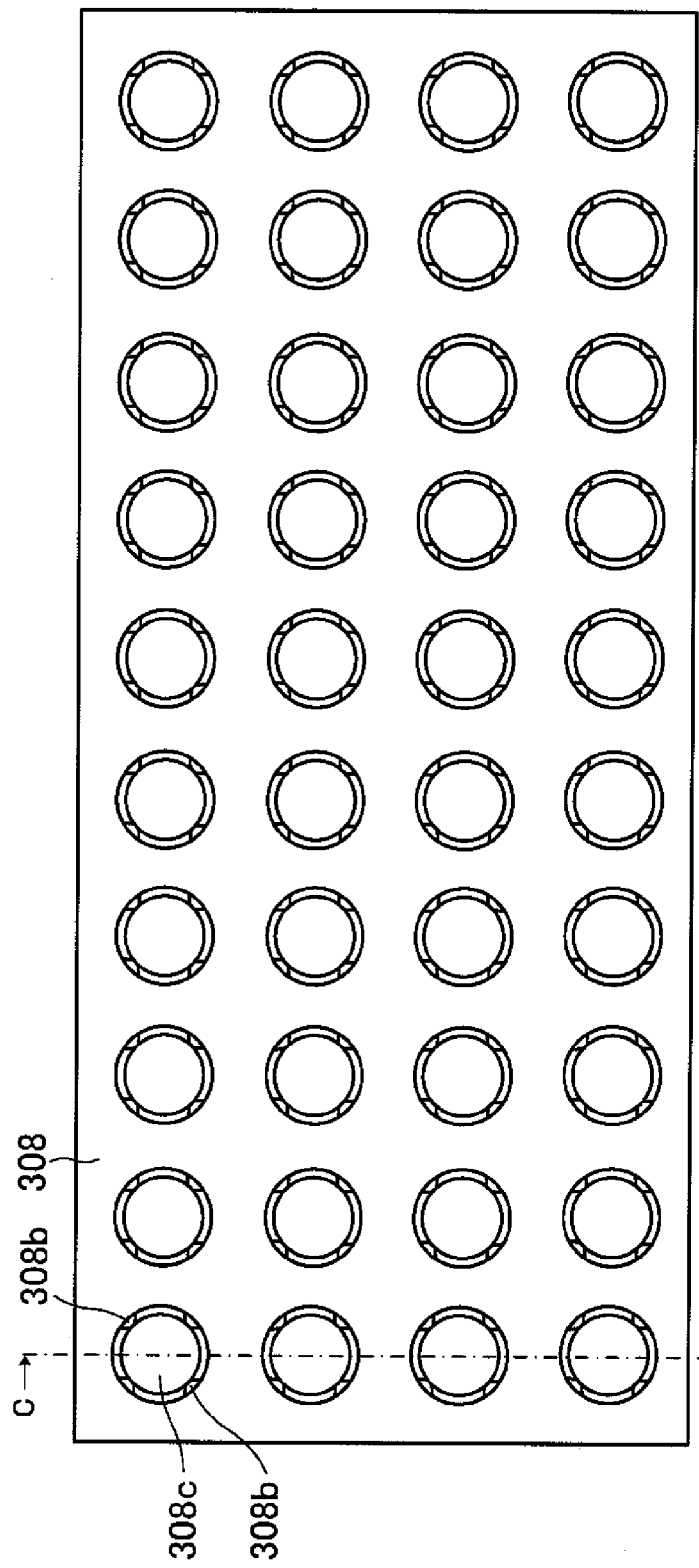
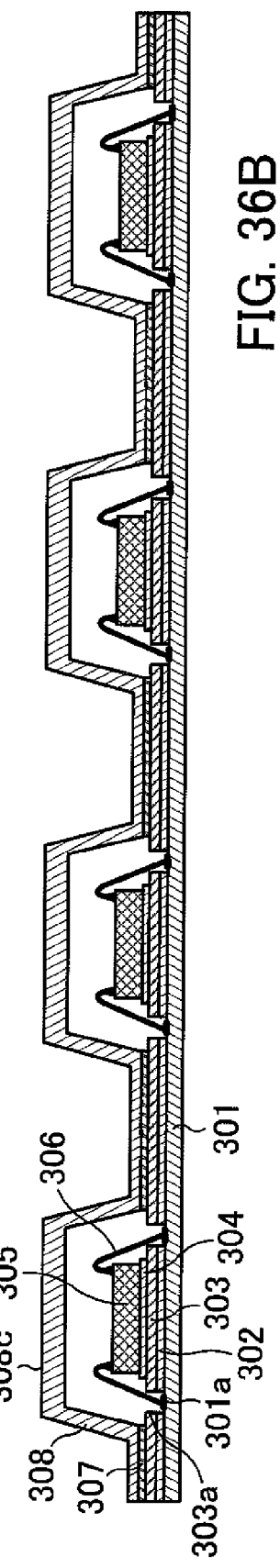
FIG. 36A
FIG. 36B

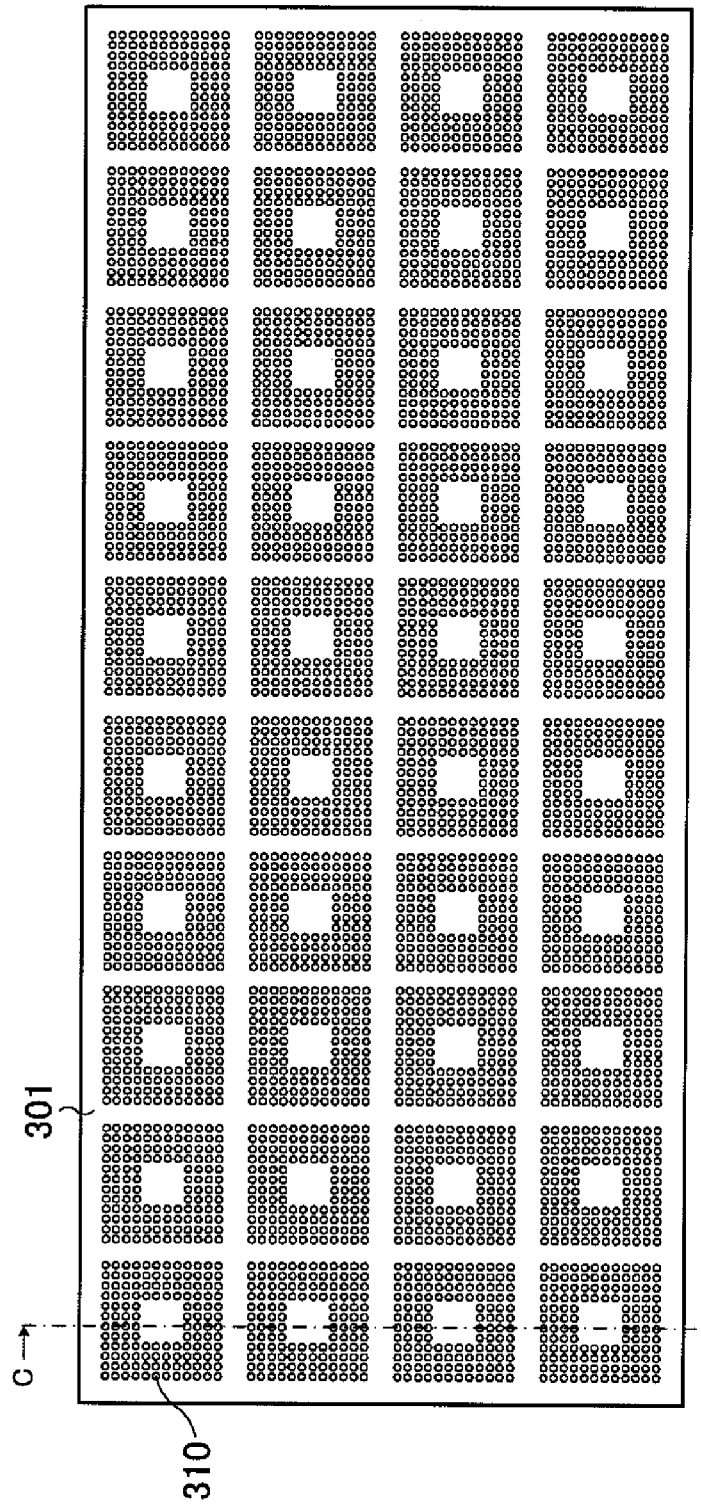
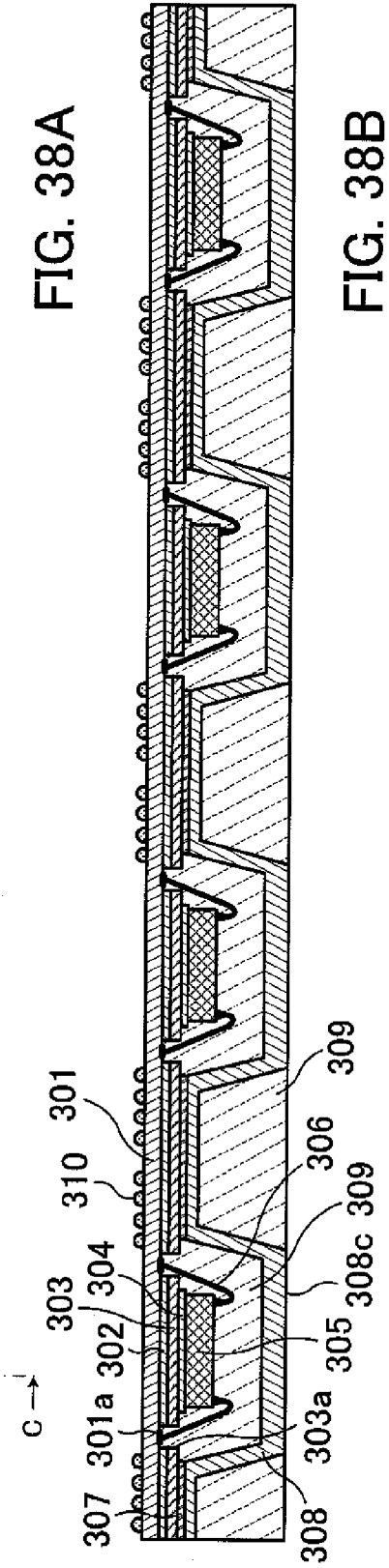

SEMICONDUCTOR DEVICE AND METHOD FOR FABRICATING THE SAME

CROSS-REFERENCE TO RELATED APPLICATIONS

This application is based upon and claims the benefits of priority from the prior Japanese Patent Application No. 2006-249233, filed on Sep. 14, 2006, the entire contents of which are incorporated herein by reference.

BACKGROUND OF THE INVENTION (1) Field of the Invention

This invention relates to a semiconductor device and a method for fabricating such a semiconductor device and, more particularly, to a semiconductor device with a heat sink mechanism and a method for fabricating such a semiconductor device.

(2) Description of the Related Art

The semiconductor integrated circuit element which is a kind of semiconductor device includes electronic circuits formed by interconnecting active elements, such as transistors, and passive elements, such as capacitive elements, formed on a semiconductor substrate made of silicon or gallium arsenide.

To stabilize the operation of electronic circuits, a semiconductor integrated circuit element (semiconductor element) is sealed by an insulator, such as resin, or is put into a container hermetically sealed.

With such a semiconductor device, it is necessary to radiate heat which is generated in a semiconductor element at the time of the operation of electronic circuits to the outside.

For example, a heat sink structure shown in FIG. 40 has traditionally been used for radiating heat.

FIG. 40 shows a semiconductor device 400 of what is called a ball grid array (BGA) type.

FIG. 40A shows the top of the semiconductor device 400 and FIG. 40B shows a section along lines X-X of FIG. 40A.

With the semiconductor device 400, a semiconductor element 403 is mounted over a wiring board 401 with an adhesive material 402 therebetween. Electrodes of the semiconductor element 403 are connected to terminals 401a located over the wiring board 401 by bonding wires 404.

In addition, a heat sink member (heat spreader) 406 stuck over the wiring board 401 by an adhesive material 405 is located over the semiconductor element 403 so as to cover the semiconductor element 403.

A sealing resin 407 is located between the heat sink member 406 and the semiconductor element 403 and an outer side of the heat sink member 406 is covered with the sealing resin 407.

On the other hand, a plurality of solder balls are located on or under an other surface of the wiring board 401, that is to say, on or under a surface of the wiring board 401 opposite to the surface over which the semiconductor element 403 is mounted as external connection terminals 408.

With the semiconductor device 400 having the above structure, heat generated in the semiconductor element 403 is transmitted to the heat sink member 406 mainly via the sealing resin 407 which covers the semiconductor element 403, and is released from a top 406a of the heat sink member 406 to the outside.

In addition to the above semiconductor device, a semiconductor device of the BGA type (see Japanese Patent Laid-Open Publication No. 2000-294694) in which a first heat sink member is located on the side of a top of a semiconductor element mounted over a wiring board and in which a second heat sink member which pierces the wiring board is located on the side of the reverse of the semiconductor element or a semiconductor device (see Japanese Patent Laid-Open Publication No. 2005-109526) in which a semiconductor element located between a pair of flat-plate heat sink members with solder or the like therebetween is sealed by resin is proposed as a semiconductor device with a heat sink mechanism.

With the above-mentioned semiconductor device of what is called the BGA type, most of the surface of the wiring board 401 where the semiconductor element 403 is mounted is covered with the sealing resin 407 in order to physically and chemically protect the semiconductor element 403 and the heat sink member 406 which covers the semiconductor element 403.

However, the thermal conductivity of the sealing resin 407 is comparatively low. This contributes to a decrease in the efficiency of heat sink of heat generated in the semiconductor element 403 to the outside via the heat sink member 406.

SUMMARY OF THE INVENTION

The present invention was made under the background circumstances described above. An object of the present invention is to provide a semiconductor device having superior heat sink characteristics and a method for fabricating such a semiconductor device.

In order to achieve the above object, a semiconductor device comprising a first heat sink member, a semiconductor element located over the first heat sink member, a second heat sink member which covers the semiconductor element and which is thermally connected to the first heat sink member, and an insulating member located between the semiconductor element and the second heat sink member.

In addition, in order to achieve the above object, a method for fabricating a semiconductor device, comprising the steps of locating a first heat sink member over a board, locating a semiconductor element over the first heat sink member, electrically connecting the semiconductor element and the board, and joining a second heat sink member which covers the semiconductor element to the first heat sink member is provided.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 31A is a schematic plan view showing a wiring board applied to a semiconductor device according to a twelfth embodiment of the present invention, and FIG. 31B is a schematic sectional view showing the wiring board applied to the semiconductor device according to the twelfth embodiment of the present invention.

FIG. 32A is a schematic plan view showing a state in which an adhesive material is formed over the wiring board, and FIG. 32B is schematic sectional view showing the state in which the adhesive material is formed over the wiring board.

FIG. 33A is a schematic plan view showing a state in which a first heat sink member is located over the wiring board, and FIG. 33B is schematic sectional view showing the state in which the first heat sink member is located over the wiring board.

FIG. 34A is a schematic plan view showing a state in which a semiconductor element is stuck over the first heat sink member, and FIG. 34B is a schematic sectional view showing the state in which the semiconductor element is stuck over the first heat sink member.

FIG. 35A is a schematic plan view showing the state of wire bonding performed on the semiconductor element, and FIG. 35B is a schematic sectional view showing the state of the wire bonding performed on the semiconductor element.

FIG. 36A is a schematic plan view showing a state in which a second heat sink member is located, and FIG. 36B is a schematic sectional view showing the state in which the second heat sink member is located.

FIG. 38A is a schematic plan view showing a state in which external connection terminals are located on or under the other surface of the wiring board, and FIG. 38B is a schematic sectional view showing the state in which the external connection terminals are located on or under the other surface of the wiring board.

DESCRIPTION OF THE PREFERRED EMBODIMENTS

Embodiments of the present invention will now be described in detail with reference to the drawings.

A semiconductor device according to a first embodiment of the present invention will be described by the use of the drawings.

Figure 1:
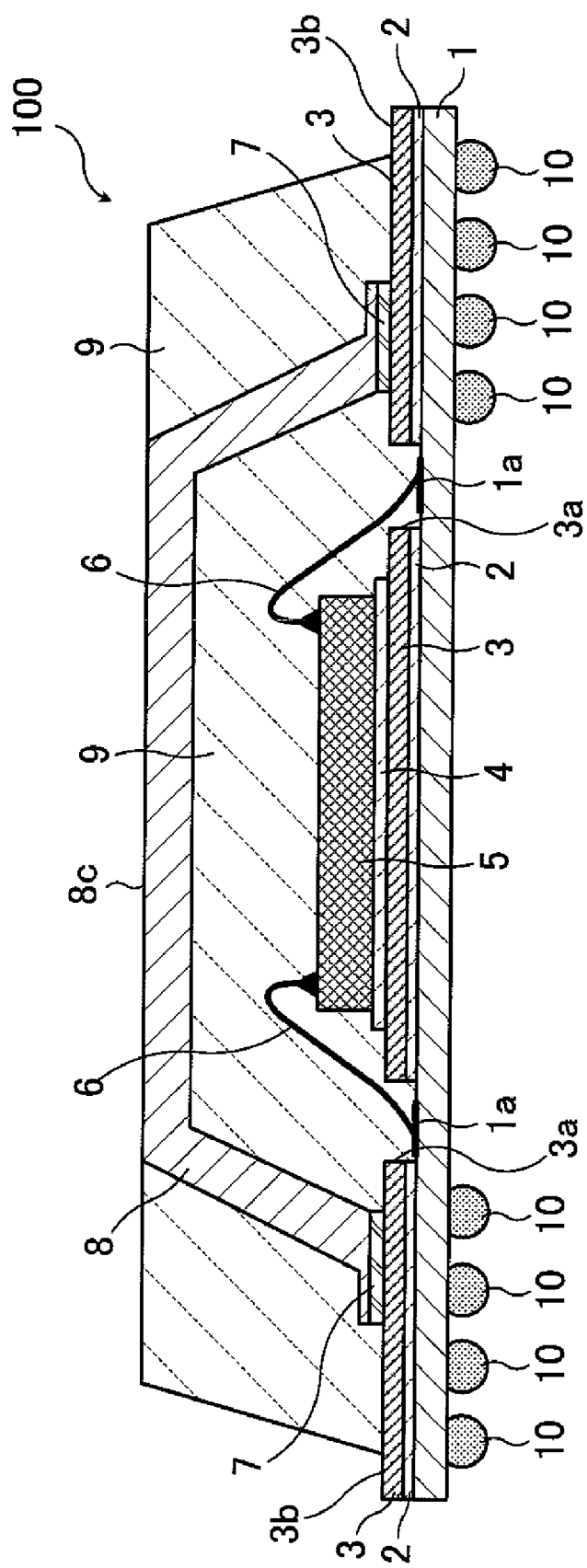
FIG. 1 is a schematic sectional view showing a semiconductor device according to a first embodiment of the present invention.
Figure 2:
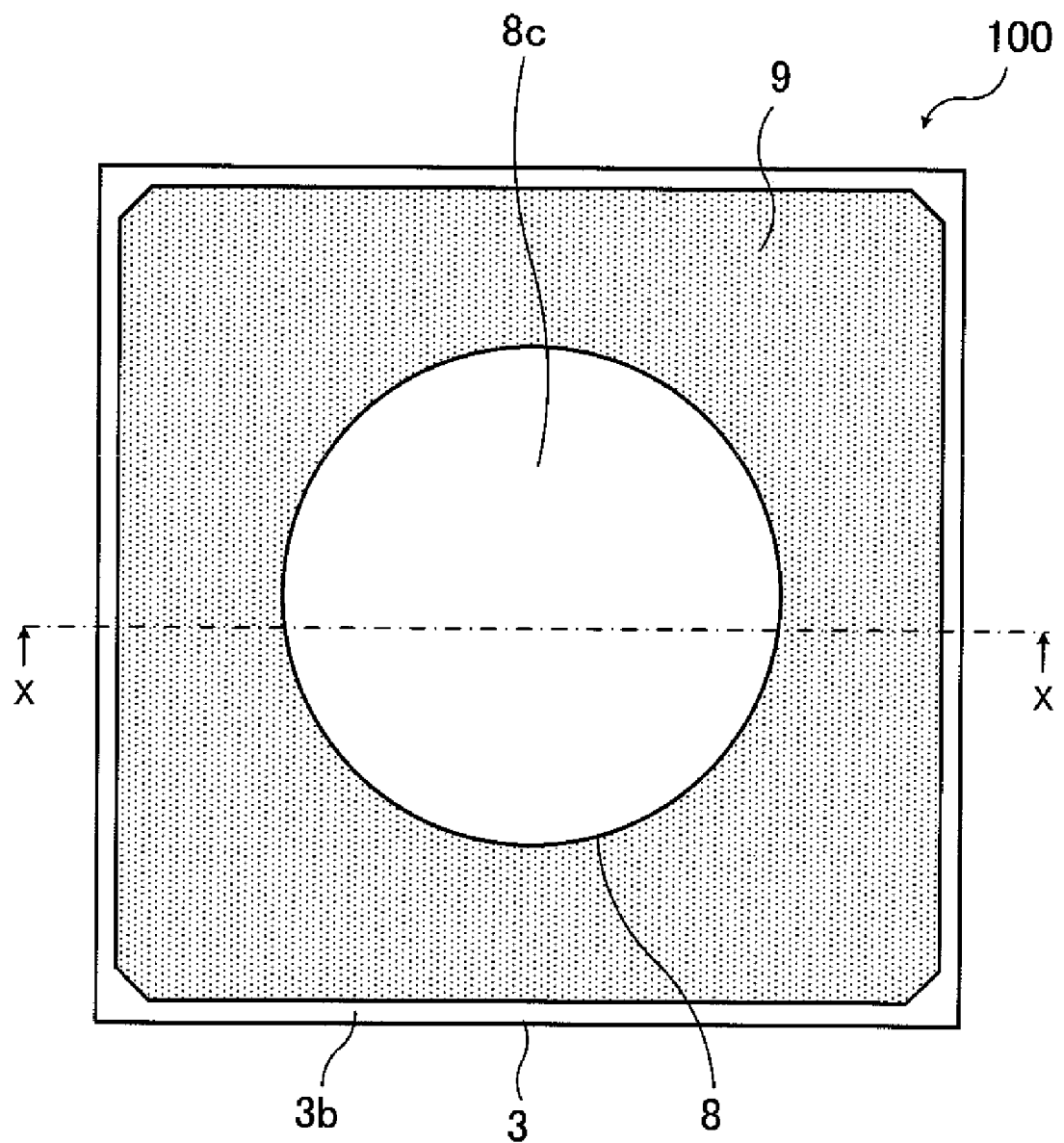
FIG. 2 is a schematic plan view showing the semiconductor device according to the first embodiment of the present invention.

FIG. 1 shows a section of a semiconductor device 100 according to the first embodiment of the present invention. FIG. 2 shows the top of the semiconductor device 100 and FIG. 3 shows the bottom of the semiconductor device 100.

Figure 3:
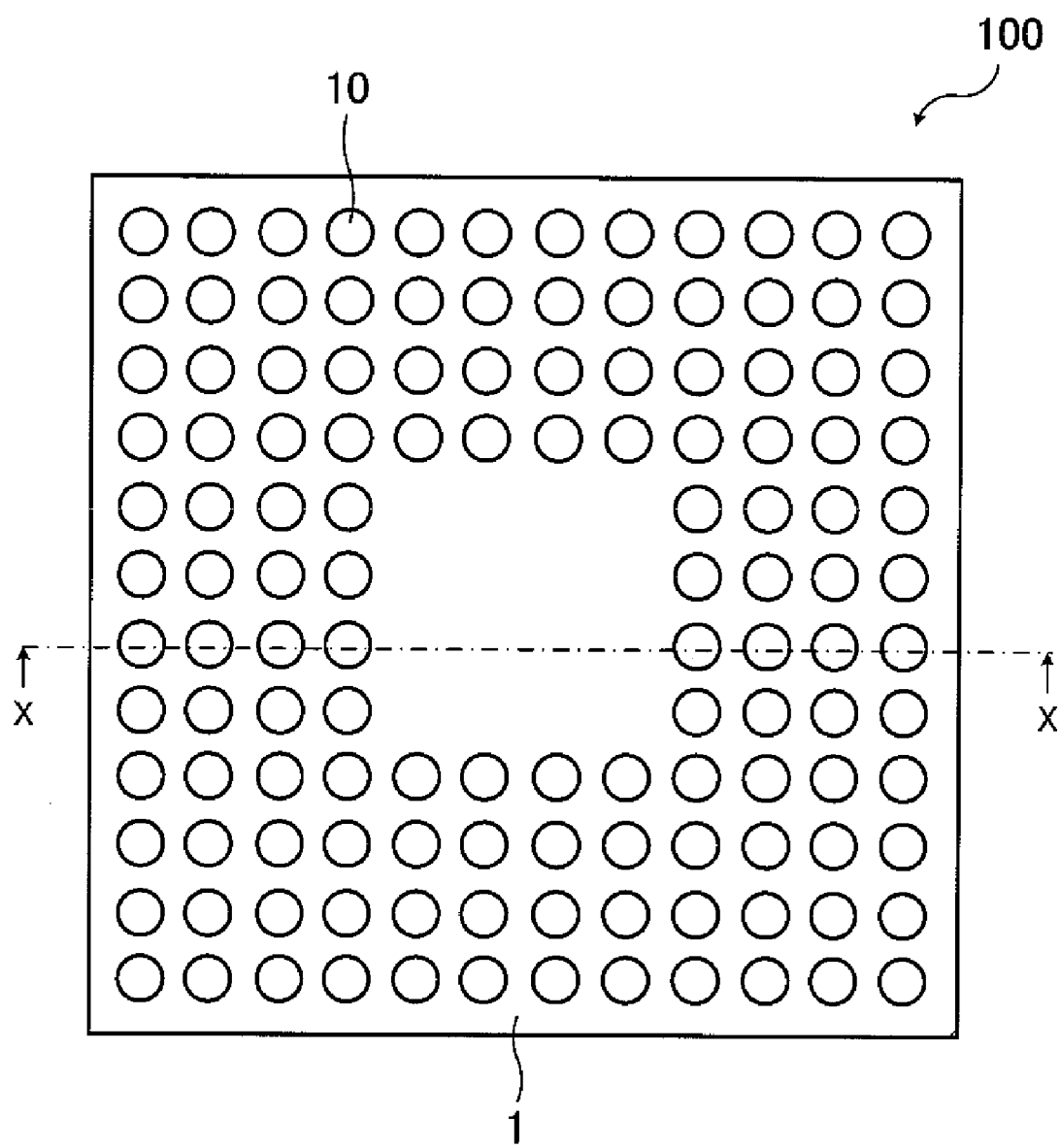
FIG. 3 is a schematic rear view showing the semiconductor device according to the first embodiment of the present invention.

FIG. 1 shows a section along lines X-X of FIG. 2 or 3.

With the semiconductor device 100 according to the first embodiment of the present invention, a first heat sink member (heat spreader) 3 is located over one surface of a wiring board 1, that is to say, over a surface of the wiring board 1 where a semiconductor element is to be mounted with an adhesive material 2, such as epoxy resin, therebetween. Wiring patterns over the wiring board 1 are not shown.

The wiring board 1 is an insulating board which is made of glass epoxy resin or the like and on or in which a wiring layer that is a metal layer of, for example, copper (Cu) is formed. Electrode terminals 1a are located over the wiring board 1. The wiring board 1 is also referred to as an interposer or a supporting board.

Figure 4:
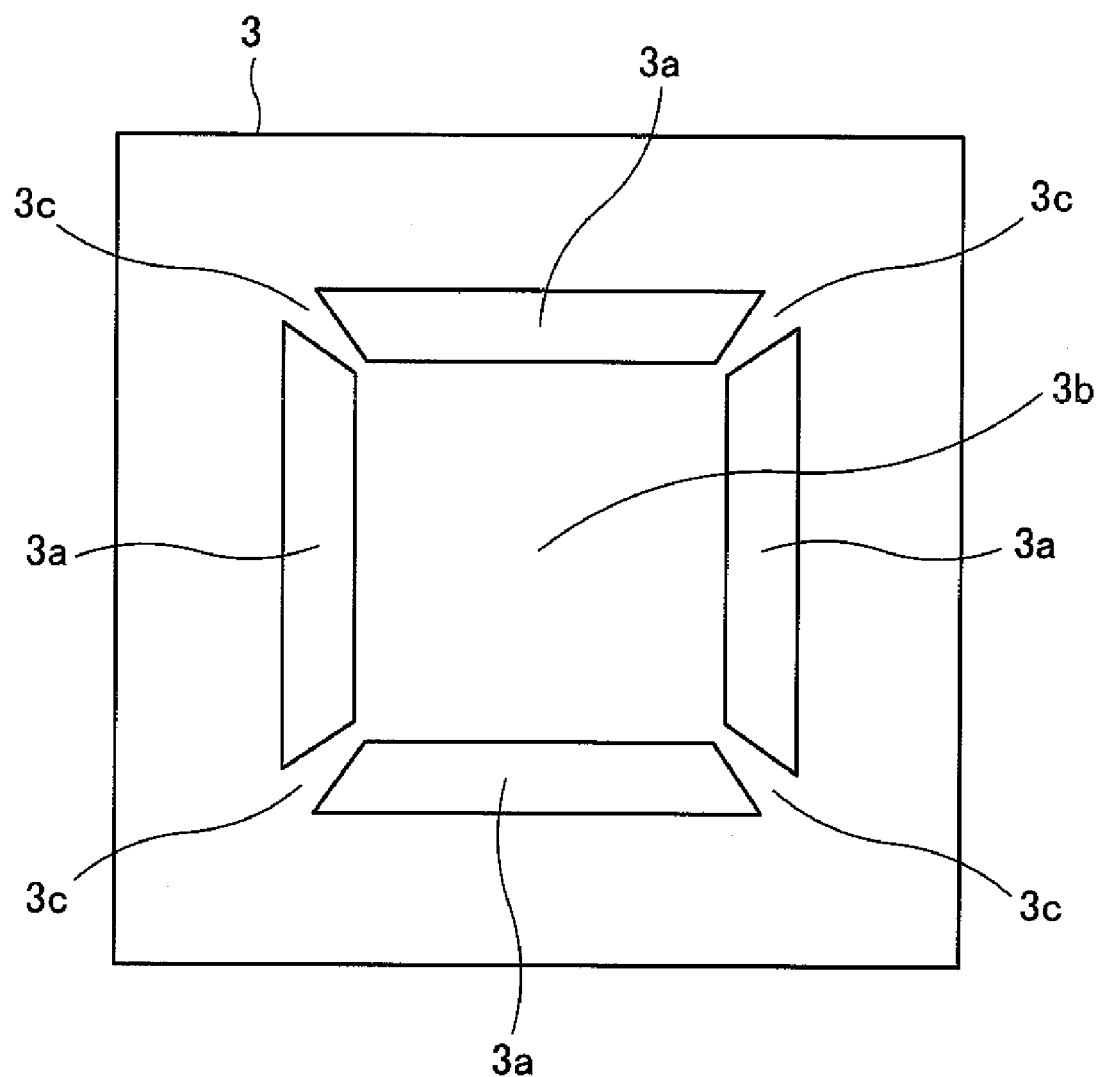
FIG. 4 is a schematic plan view showing a first heat sink member.
Figure 5:
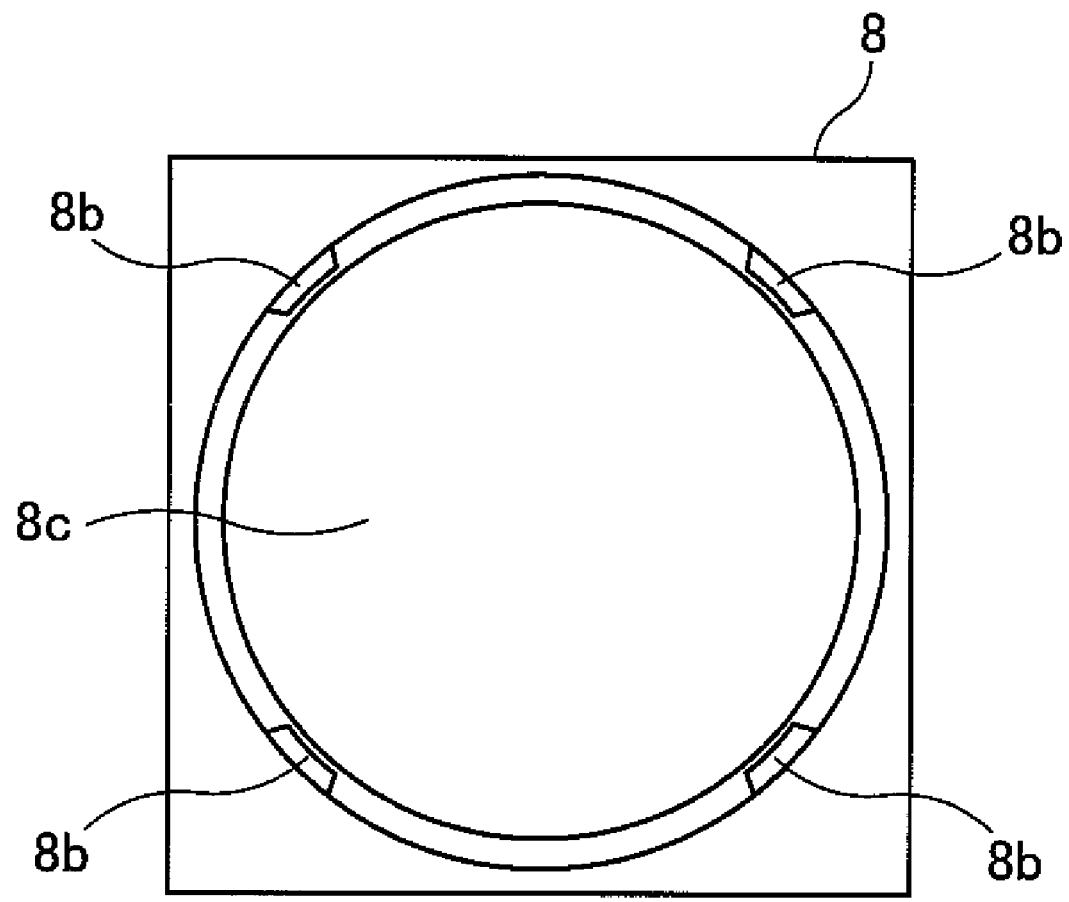
FIG. 5 is a schematic plan view showing a second heat sink member.

As shown in FIG. 4, the first heat sink member 3 is like a flat plate. A plurality of (four, in this example) openings 3a are formed in areas of the first heat sink member 3 corresponding to the electrode terminals 1a located over the wiring board 1. The electrode terminals 1a are exposed in the openings 3a in a state in which the first heat sink member 3 is located over the wiring board 1.

The first heat sink member 3 is a plate-like member made of copper (Cu), a copper alloy, an aluminum (Al) alloy, stainless steel, an iron (Fe) alloy, a nickel (Ni) alloy, or the like. A material having higher thermal conductivity is selected. The openings 3a are formed by press work or etching.

A semiconductor element 5 is placed and stuck over an area 3b inside the openings 3a of the first heat sink member 3 with an adhesive material 4 which is a sheet adhesive, such as a die bonding film, or a paste adhesive therebetween. That is to say, the area 3b is a semiconductor element mounting portion.

Electrodes (not shown) of the semiconductor element 5 are connected to the electrode terminals 1a located on the wiring board 1 by bonding wires 6 made of gold (Au).

A second heat sink member 8 is stuck over areas 3c between the openings 3a of the first heat sink member 3 and the area 3b outside the openings 3a of the first heat sink member 3 by the use of a conductive adhesive material 7 such as soldering paste. That is to say, the first heat sink member 3 can thermally be connected to the second heat sink member 8.

Figure 6:
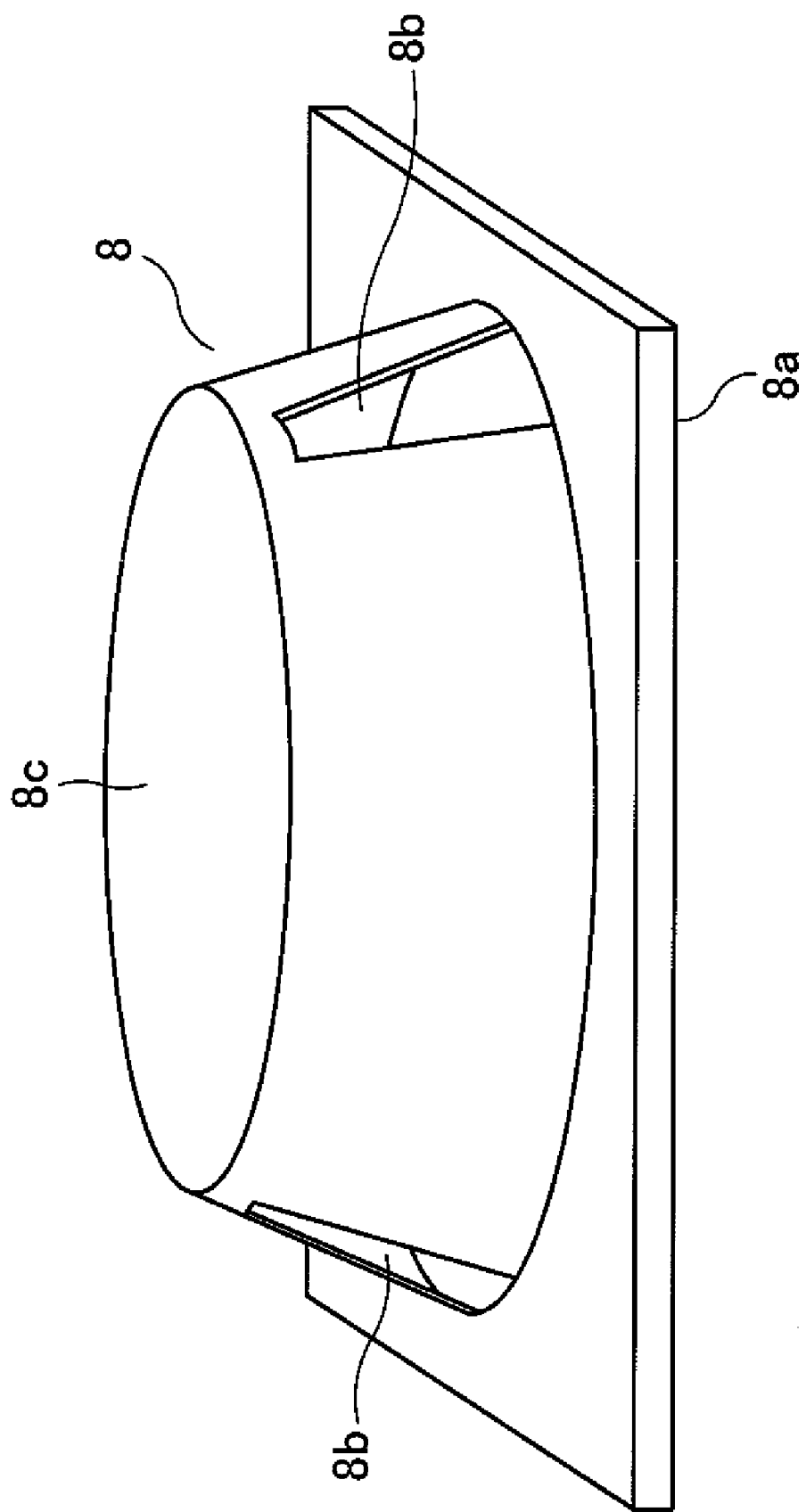
FIG. 6 is a schematic perspective view showing the second heat sink member.

As shown in FIG. 6, the second heat sink member 8 includes a flat base, an inclined plane portion having an approximately conical shape, and a flat top. That is to say, the second heat sink member 8 is domed and has a trapezoidal space. The second heat sink member 8 is separate from the semiconductor element 5 and the bonding wires 6 and covers the semiconductor element 5 and the bonding wires 6.

A plate-like member made of copper (Cu), a copper alloy, an aluminum (Al) alloy, stainless steel, an iron (Fe) alloy, a nickel (Ni) alloy, or the like is used for forming the second heat sink member 8 by, for example, press work. This is the same with the first heat sink member 3.

The flat base 8a of the second heat sink member 8 is stuck over the areas 3c between the openings 3a of the first heat sink member 3 and the area 3b outside the openings 3a of the first heat sink member 3 with the conductive adhesive material 7 therebetween. In addition, a plurality of (four, in this example) heat release holes 8b are cut in the inclined plane portion of the second heat sink member 8 having an approximately conical shape. A sealing resin 9 can be poured from the heat release holes 8b to fill space around the semiconductor element 5.

The semiconductor element 5 and the bonding wires 6 contained in the trapezoidal space of the second heat sink member 8, the side of the second heat sink member 8, and an exposed surface of the first heat sink member 3 are covered with the sealing resin 9. As a result, the semiconductor element 5 is hermetically sealed.

The edge portion 3b of the first heat sink member 3 and the flat top 8c of the second heat sink member 8 are not covered with the sealing resin 9 and are exposed.

A plurality of solder balls are located on or under the other surface (reverse) of the wiring board 1 as external connection terminals 10.

As stated above, with the semiconductor device 100 according to the first embodiment of the present invention the first heat sink member 3 is located over one surface of the wiring board 1 and the semiconductor element 5 is located over the first heat sink member 3.

The second heat sink member 8 thermally connected to the first heat sink member 3 is located so as to cover the semiconductor element 5. By locating the heat sink members in this way, heat generated in the semiconductor element 5 is efficiently transmitted first to the first heat sink member 3 and is released from the exposed edge portion 3b of the first heat sink member 3 not covered with the sealing resin 9. The heat generated in the semiconductor element 5 is also transmitted from the first heat sink member 3 to the second heat sink member 8 via the conductive adhesive material 7 and is released from the exposed flat top 8c of the second heat sink member 8.

As stated above, with the semiconductor device 100 according to the first embodiment of the present invention a heat sink path is formed by the first heat sink member 3 and the second heat sink member 8 and heat generated in the semiconductor element 5 is efficiently released to the outside.

With the semiconductor device 100 heat generated in the semiconductor element 5 is also transmitted to the second heat sink member 8 via the surrounding sealing resin 9 and is released from the flat top 8c of the second heat sink member 8.

Moreover, heat transmitted to the second heat sink member 8 via the sealing resin 9 is transmitted to the first heat sink member 3 and is released from the edge portion 3b of the first heat sink member 3.

As described above, the second heat sink member 8 is stuck over the first heat sink member 3 by the use of the conductive adhesive material 7 such as soldering paste. Therefore, thermal connection exists between the first heat sink member 3 and the second heat sink member 8. That is to say, efficiency in thermal conduction between the first heat sink member 3 and the second heat sink member 8 is very high.

Furthermore, by locating the first heat sink member 3 over one surface of the wiring board 1, the rigidity of the wiring board 1 substantially becomes high. As a result, the wiring board 1 does not warp, for example, when sealing is performed by the use of the sealing resin 9.

Therefore, the flatness of the plurality of external connection terminals 10 located on or under the other surface of the wiring board 1 can be secured and the semiconductor device 100 can be mounted on, for example, a circuit board (what is called a mother board) in an electronic machine easily and reliably.

Figure 7A:
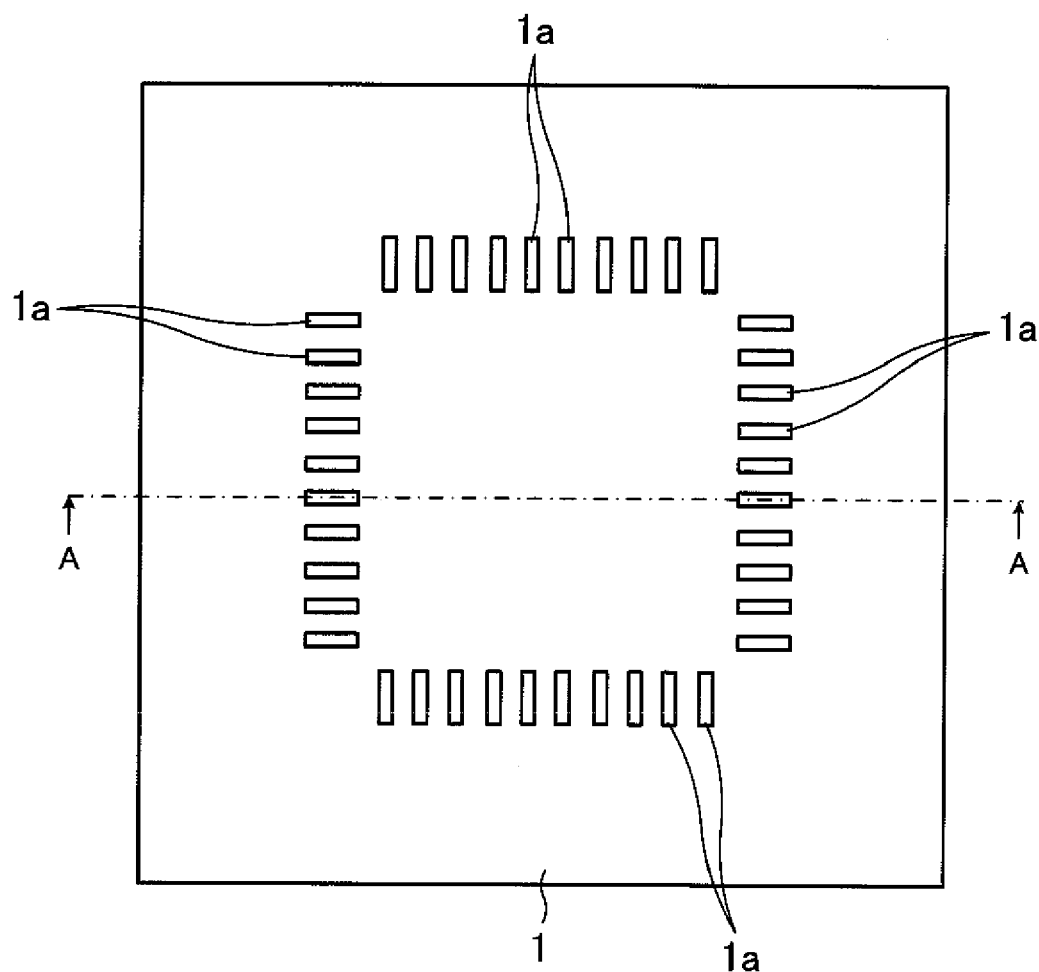
FIG. 7A is a schematic plan view showing a wiring board applied to the semiconductor device according to the first embodiment of the present invention and FIG. 7B is a schematic sectional view showing the wiring board applied to the semiconductor device according to the first embodiment of the present invention.
Figure 7B:
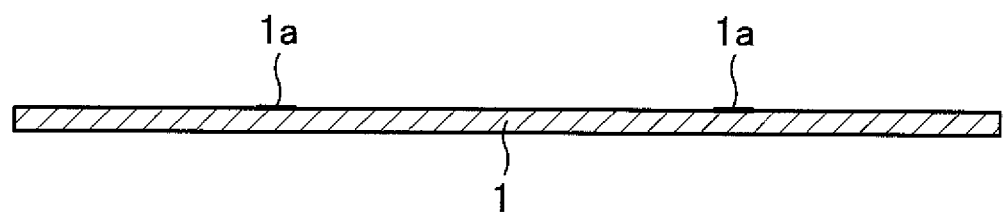
Figure 8A:
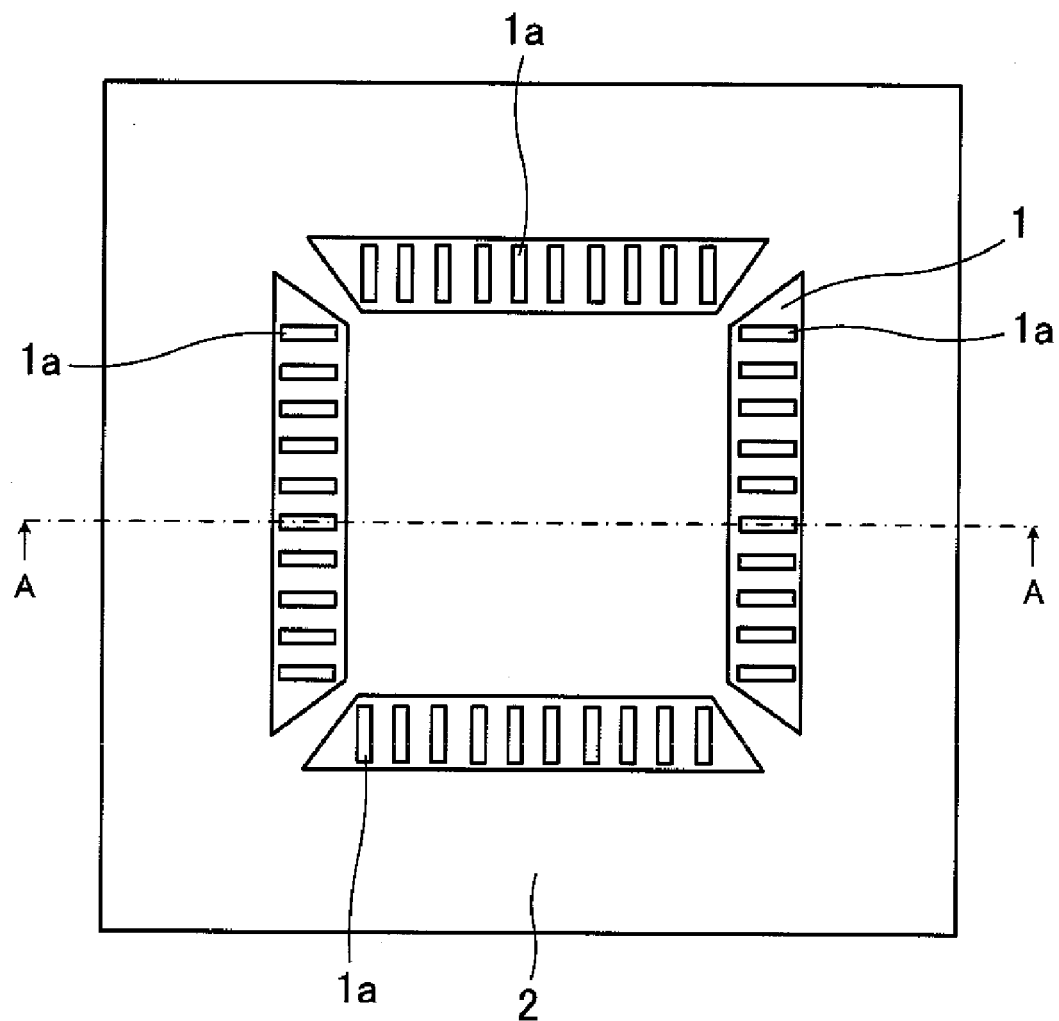
FIG. 8A is a schematic plan view showing a state in which an adhesive material is formed over a wiring board.
Figure 8B:
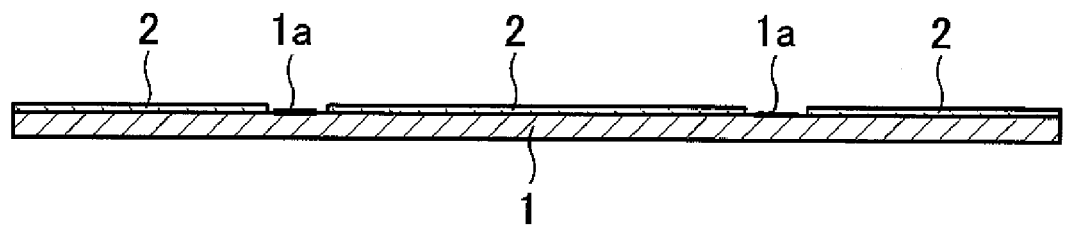
FIG. 8B is schematic sectional view showing the state in which the adhesive material is formed over the wiring board.
Figure 9A:
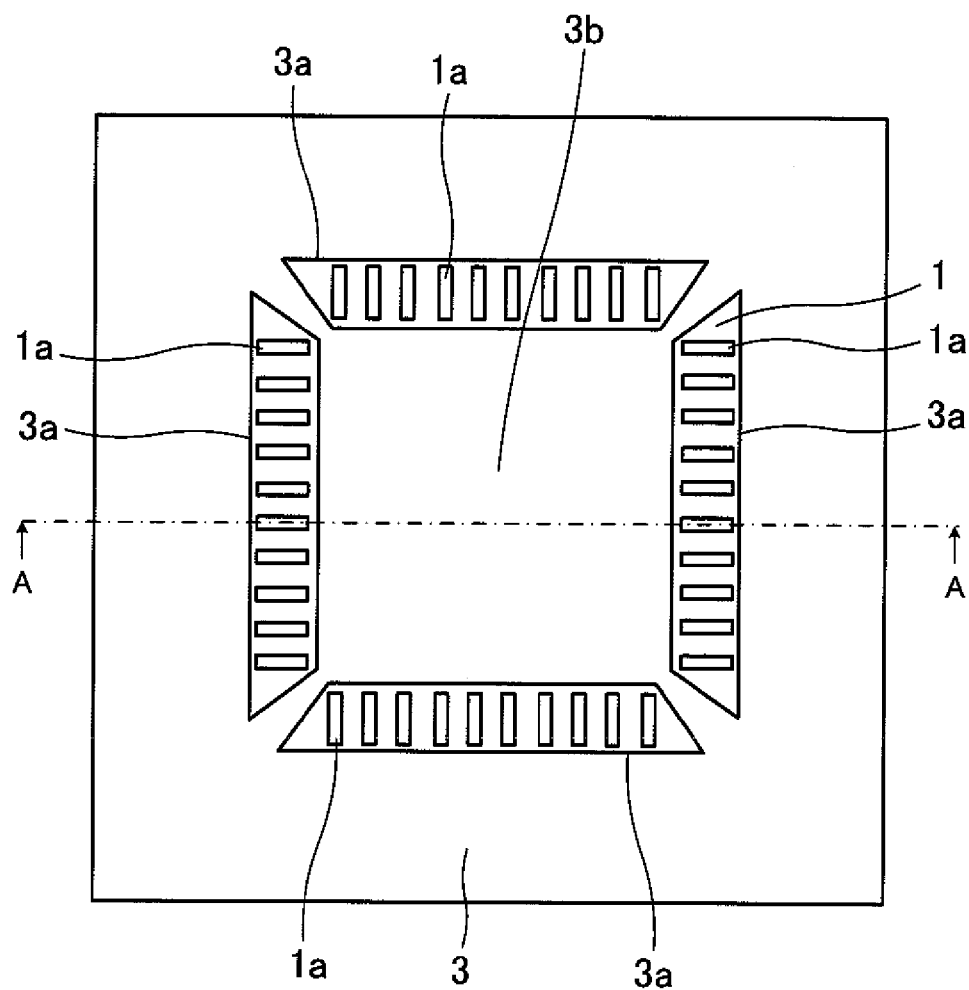
FIG. 9A is a schematic plan view showing a state in which a first heat sink member is located over the wiring board.
Figure 9B:
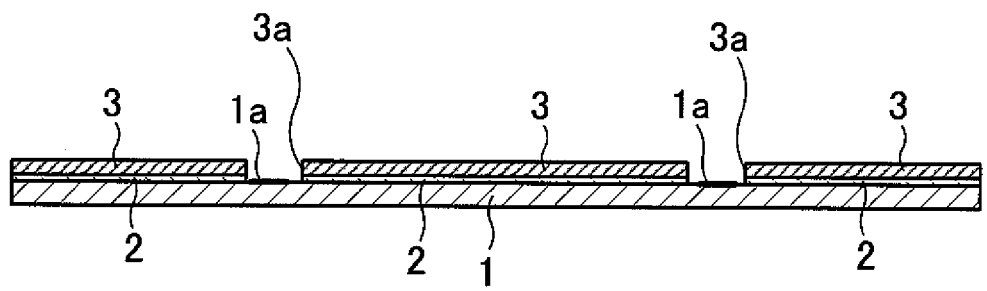
FIG. 9B is schematic sectional view showing the state in which the first heat sink member is located over the wiring board.
Figure 10A:
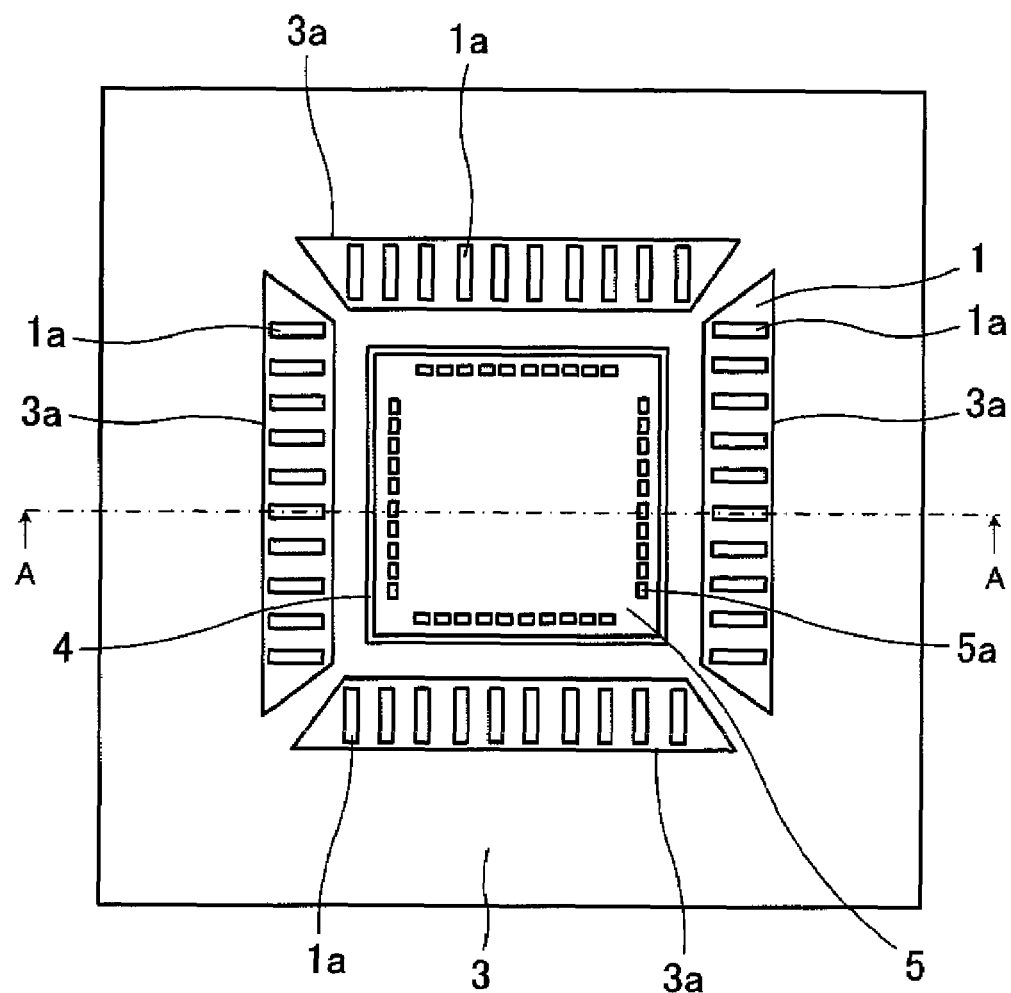
FIG. 10A is a schematic plan view showing a state in which a semiconductor element is stuck over the first heat sink member.
Figure 10B:
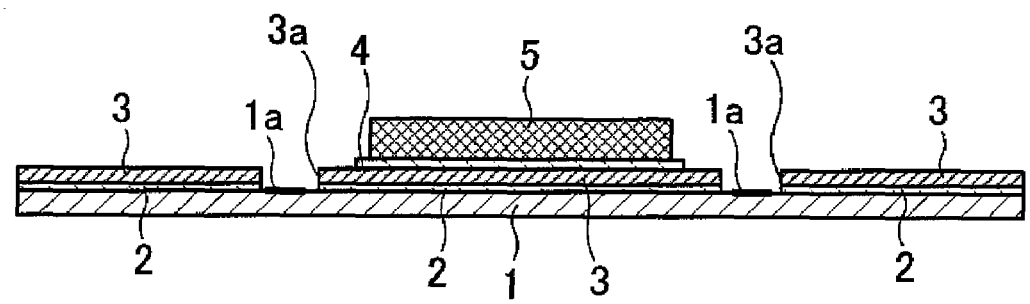
FIG. 10B is a schematic sectional view showing the state in which the semiconductor element is stuck over the first heat sink member.
Figure 11A:
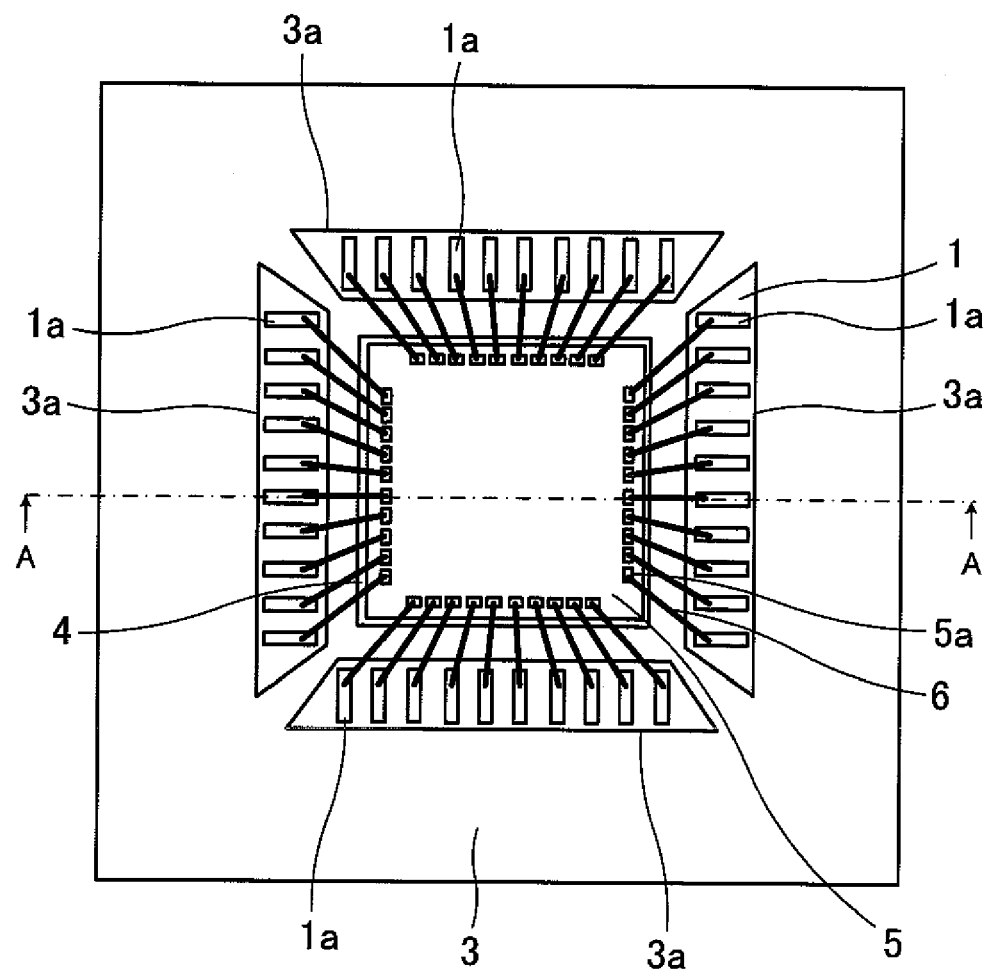
FIG. 11A is a schematic plan view showing the state of wire bonding performed on the semiconductor element.
Figure 11B:
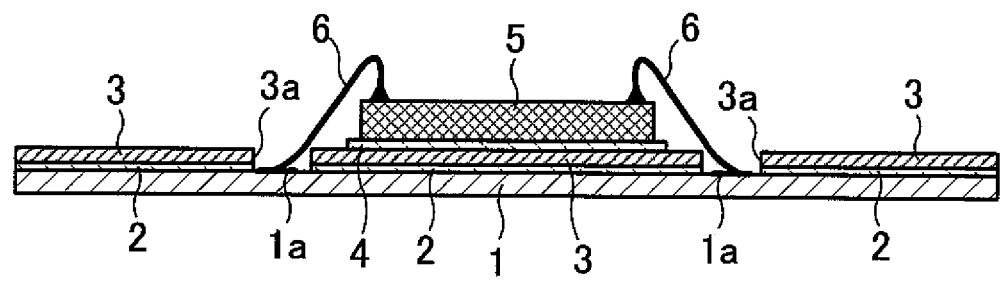
FIG. 11B is a schematic sectional view showing the state of the wire bonding performed on the semiconductor element.
Figure 12A:
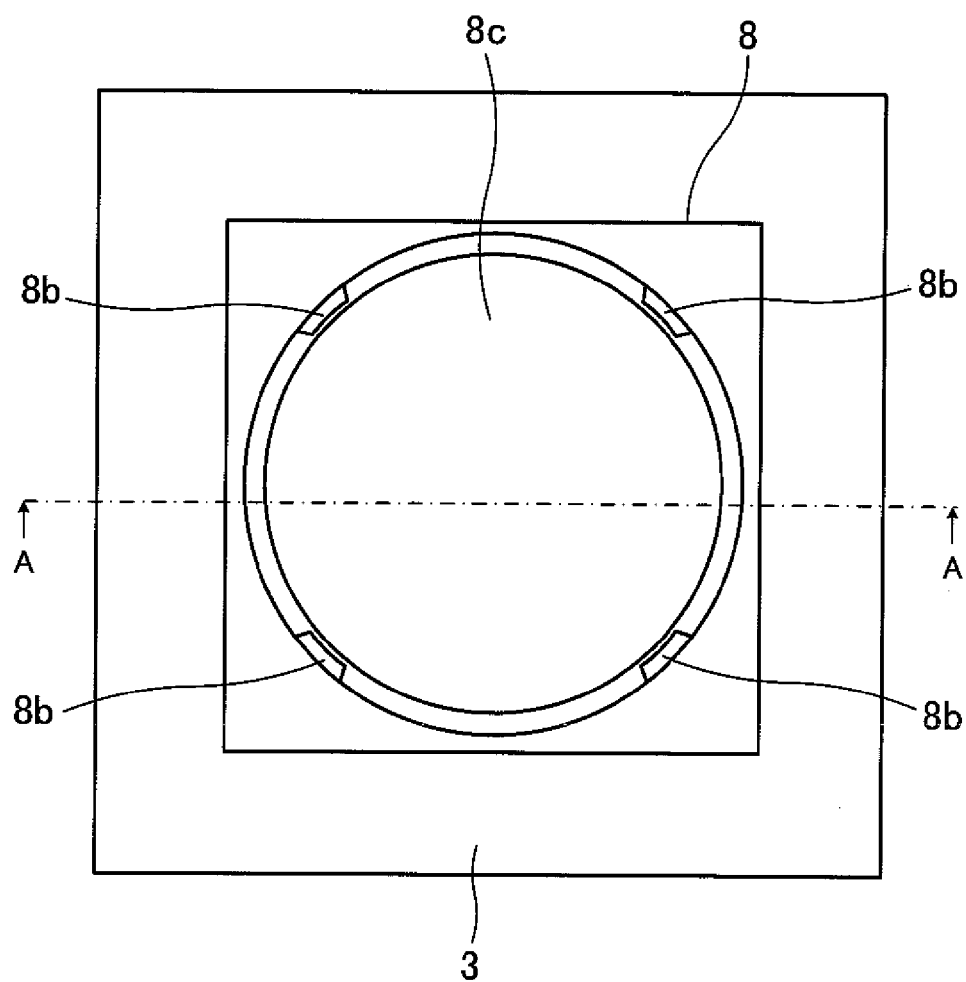
FIG. 12A is a schematic plan view showing a state in which a second heat sink member is located.
Figure 12B:
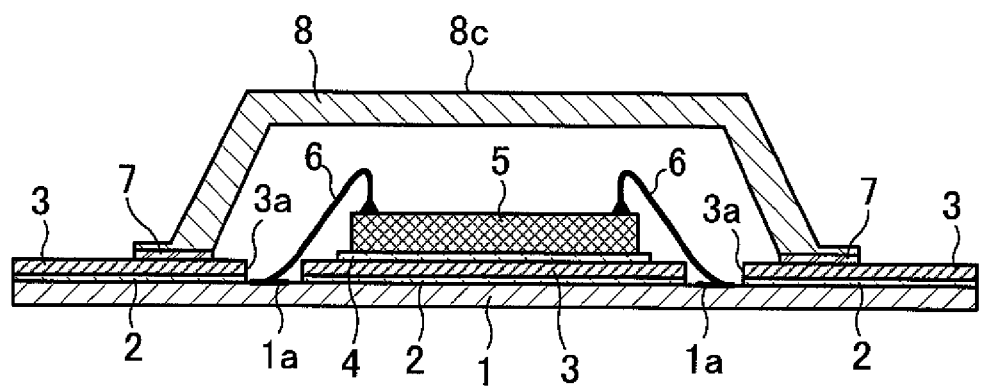
FIG. 12B is a schematic sectional view showing the state in which the second heat sink member is located.
Figure 13A:
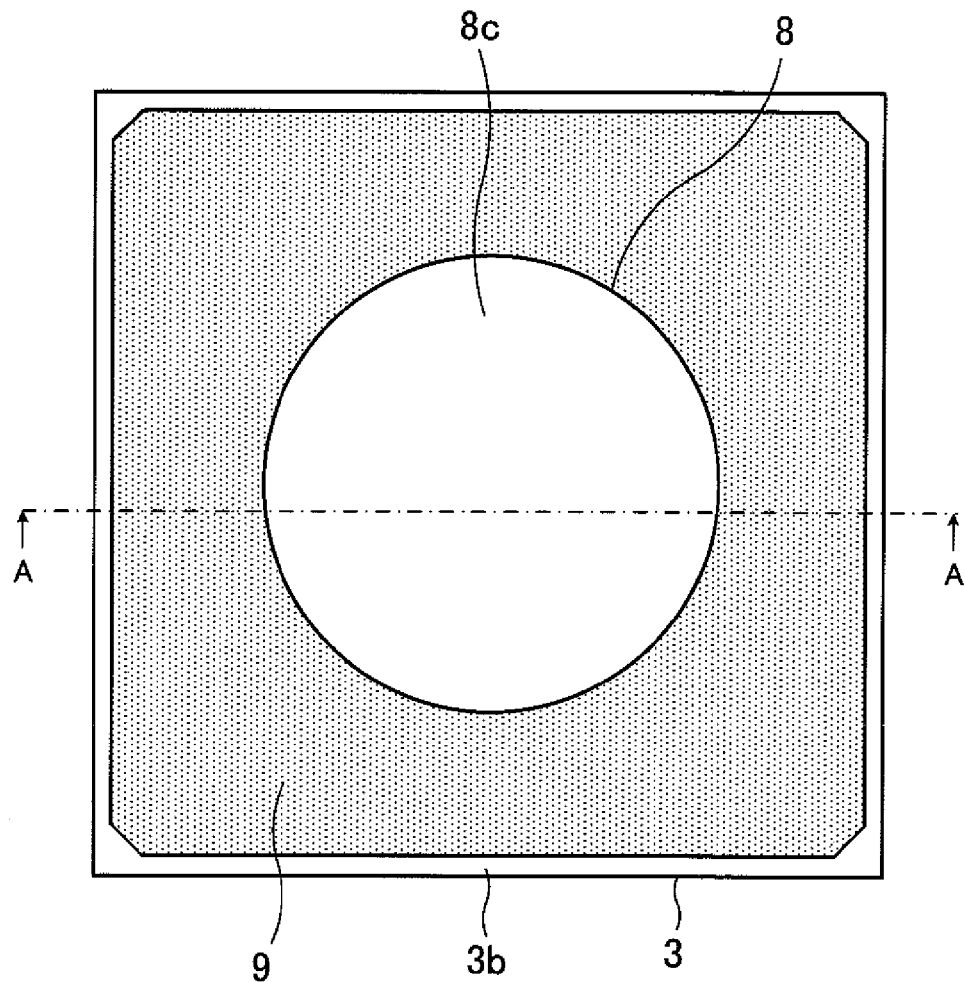
FIG. 13A is a schematic plan view showing a resin sealing structure of the semiconductor device according to the first embodiment of the present invention and FIG. 13B is a schematic sectional view showing the resin sealing structure of the semiconductor device according to the first embodiment of the present invention.
Figure 13B:
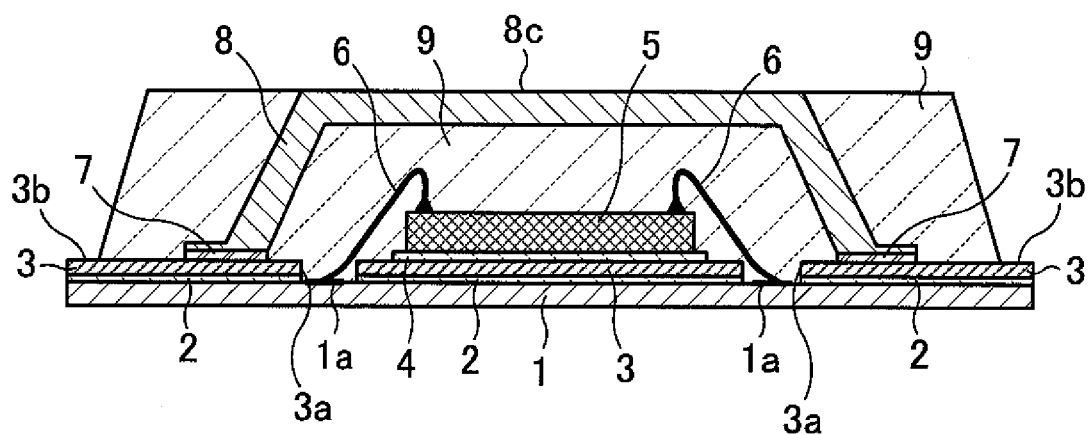

A method for fabricating the semiconductor device 100 will now be described. FIGS. 7 through 13 give an overview of processes for fabricating the semiconductor device 100. Each of FIGS. 7A, 8A, 9A, 10A, 11A, 12A, and 13A schematically shows the shape from above of the semiconductor device 100. FIG. 7B schematically shows a section along lines A-A of FIG. 7A. The same applies to FIGS. 8B, 9B, 10B, 11B, 12B, and 13B.

The wiring board 1 shown in FIG. 7 is provided first. The wiring board 1 is laminated and has what is called a multilayer wiring layer structure. That is to say, the wiring board 1 includes a plurality of insulating substrates made of glass epoxy resin or the like. Wiring layers made of metal, such as copper (Cu), are formed on and in the wiring board 1. The terminals 1a are located over a surface (one surface) of the wiring board 1 where the semiconductor element and the first heat sink member are to be located in a later process, and electrodes for locating the external connection terminals are located on or under the reverse (other surface) of the wiring board 1.

The adhesive material 2 which is a liquid or film adhesive made of epoxy resin or the like is then located over the one surface of the wiring board 1. FIG. 8 shows this state.

The adhesive material 2 is selectively located over an area except the terminals 1a of the wiring board 1, that is to say, over an area of the wiring board 1 except portions corresponding to the openings 3a of the first heat sink member 3 which is to be placed and stuck in the next process.

The first heat sink member 3 is then stuck over the wiring board 1 by the use of the adhesive material 2. FIG. 9 shows this state. At this time the terminals 1a located over the wiring board 1 are exposed in the openings 3a of the first heat sink member 3.

The semiconductor element 5 is then mounted over the area 3b inside the openings 3a of the first heat sink member 3 with the adhesive material 4 which is a sheet adhesive, such as a die bonding film, or a paste adhesive therebetween. FIG. 10 shows this state.

Electrode pads 8a of the semiconductor element 5 and the terminals 1a of the wiring board 1 are then connected by the bonding wires 6. FIG. 11 shows this state.

The second heat sink member 8 is then located so as to cover the semiconductor element 5. The flat base 8a of the second heat sink member 8 is stuck over the first heat sink member 3 by the use of the conductive adhesive material 7 such as soldering paste. As stated above, the heat release holes 8b are cut in the inclined plane portion of the second heat sink member 8. FIG. 12 shows this state.

The process of hermetically sealing the semiconductor element 5 (sealing the semiconductor element 5 by the use of resin) is then performed. That is to say, the inside of the second heat sink member 8 is filled with the sealing resin 9 and the side of the second heat sink member 8 is covered with the sealing resin 9.

When the semiconductor element 5 is sealed by the use of the sealing resin 9, the sealing resin 9 pours into the space inside the second heat sink member 8 via the heat release holes 8b cut in the second heat sink member 8. As a result, the semiconductor element 5, together with the bonding wires 6, is sealed by the sealing resin 9. The flat top 8c of the second heat sink member 8 is exposed.

When the semiconductor element 5 is sealed by the use of the sealing resin 9, the first heat sink member 3 is covered with the sealing resin 9 in a state in which the edge portion 3b of the first heat sink member 3 is exposed. FIG. 13 shows this state.

The solder balls are then located on or under electrode pads located at predetermined positions of the other surface (reverse) of the wiring board 1 as the external connection terminals 10. By doing so, the semiconductor device 100 shown in FIG. 1 is fabricated.

As stated above, the first heat sink member 3 and the second heat sink member 8 are made of a metal material such as copper (Cu), a copper alloy, an aluminum (Al) alloy, stainless steel, an iron (Fe) alloy, or a nickel (Ni) alloy. One of these materials is selected with thermal conductivity, the amount of heat generated in the semiconductor element 5, an environment in which the semiconductor device 100 is used, or the like taken into consideration.

The thickness of the first heat sink member 3 can be set to, for example, about 0.15 to 0.25 mm. However, the thickness of the first heat sink member 3 should be selected with thermal conductivity, the size of the semiconductor device 100, the thickness of the wiring board 1, and the like taken into consideration so that fixed rigidity can be secured.

The thickness of the flat top 8c of the second heat sink member 8 can be set to 0.30 mm or more. However, the thickness of the second heat sink member 8 should be selected with thermal conductivity, the size of the semiconductor device 100, and the like taken into consideration.

A semiconductor device according to a second embodiment of the present invention will now be described.

Figure 14:
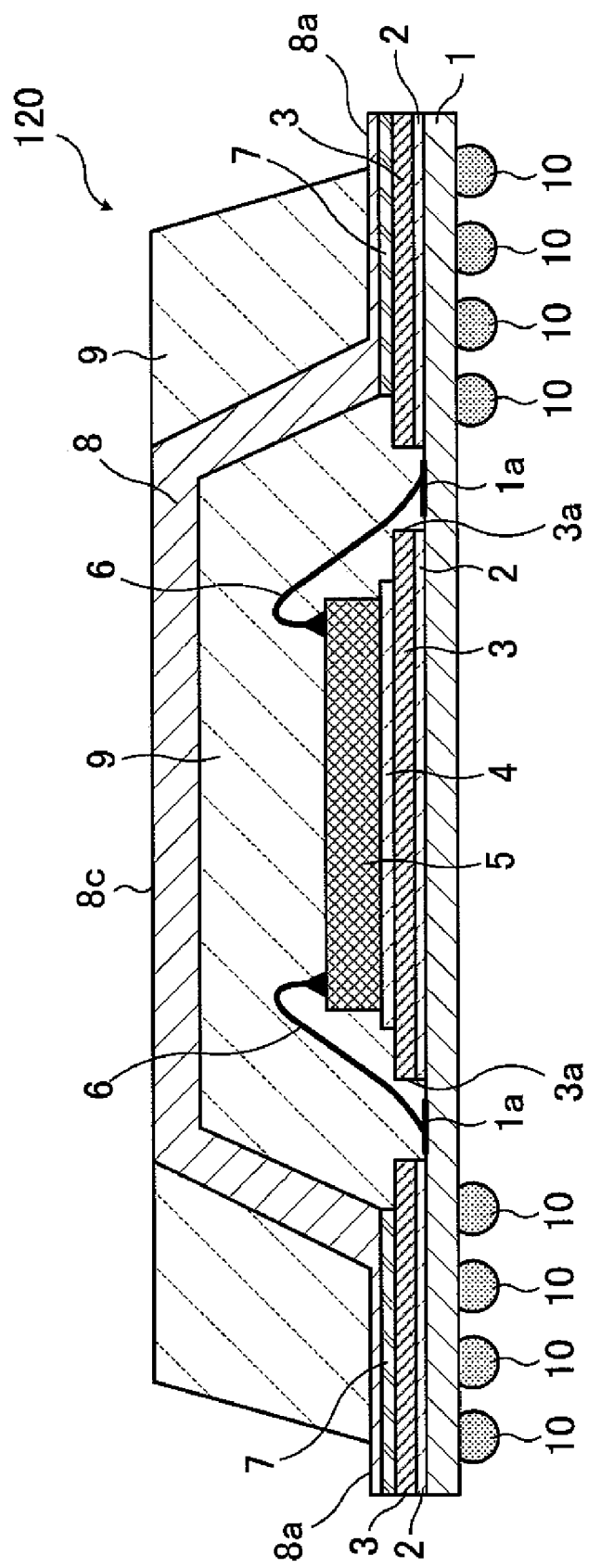
FIG. 14 is a schematic sectional view showing a semiconductor device according to a second embodiment of the present invention.

FIG. 14 shows the structure of a semiconductor device 120 according to a second embodiment of the present invention. Components in FIG. 14 that are the same as those shown in FIG. 1 are marked with the same symbols and descriptions of them will be omitted.

With the semiconductor device 120, edge portions of a flat base Ba of a second heat sink member 8 which is located over a first heat sink member 3 with a conductive adhesive material 7 therebetween is not covered with a sealing resin 9 but is exposed.

A plurality of heat release holes 8b (not shown) are cut in a side of the second heat sink member 8 and the second heat sink member 8 is covered with the sealing resin 9 except for the edge portions of the flat base 8a and a flat top 8c. This is the same with the semiconductor device 100 according to the first embodiment of the present invention.

With the semiconductor device 120 having the above structure, heat which is generated in a semiconductor element 5 and which is transmitted to the first heat sink member 3 is released from an edge portion of the first heat sink member 3 at sides of the semiconductor device 120. Moreover, the heat which is generated in the semiconductor element 5 and which is transmitted to the first heat sink member 3 is transmitted to the second heat sink member 8 and is released from the edge portions of the flat base 8a.

The heat transmitted to the second heat sink member 8 is also released from the flat top 8c.

In addition, the heat generated in the semiconductor element 5 is transmitted to the sealing resin 9 and the second heat sink member 8 and is released from the edge portions of the flat base 8a and the flat top 8c.

As stated above, by exposing the edge portions of the flat base 8a of the second heat sink member 8, efficiency in heat sink of heat from the sides of the semiconductor device 120 can be improved.

The procedure for fabricating the semiconductor device 120 differs from the procedure for fabricating the semiconductor device 100 according to the first embodiment of the present invention only in that the size of the second heat sink member 8 is made large so as not to cover the edge portions of the flat base 8a with the sealing resin 9, that is to say, so as to expose the edge portions of the flat base 8a.

A semiconductor device according to a third embodiment of the present invention will now be described.

Figure 15:
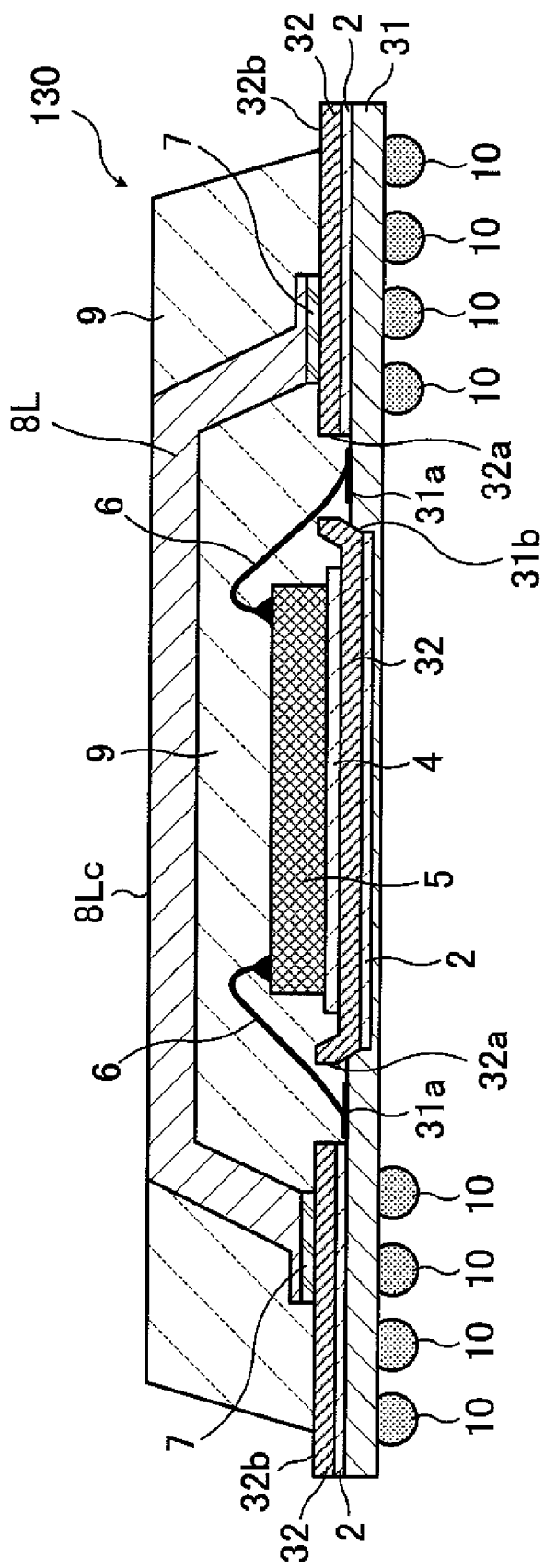
FIG. 15 is a schematic sectional view showing a semiconductor device according to a third embodiment of the present invention.

FIG. 15 shows the structure of a semiconductor device 130 according to a third embodiment of the present invention. Components in FIG. 15 that are the same as those shown in FIG. 1 are marked with the same symbols and descriptions of them will be omitted.

With the semiconductor device 130, the thickness of an area of a wiring board 31 which is surrounded by terminals 31a and over which a semiconductor element is to be mounted is selectively reduced and a depressed portion 31b is formed.

A first heat sink member 32 having a depressed portion the shape and depth of which correspond to the shape and depth of the depressed portion 31b is located over the depressed portion 31b.

The first heat sink member 32 has openings 32a in areas corresponding to the terminals 31a located over the wiring board 31. An edge portion 32b of the first heat sink member 32 is not covered with a sealing resin 9 and is exposed.

With the semiconductor device 130 having the above structure, the depressed portion is formed in the area of the wiring board 31 where the semiconductor element 5 is to be placed and stuck. By mounting the semiconductor element 5 over the depressed portion, the semiconductor element 5 is located at a lower position in the semiconductor device 130.

Compared with the semiconductor device 100 according to the first embodiment of the present invention or the semiconductor device 120 according to the second embodiment of the present invention, the thickness (height) of the semiconductor device 130 can be reduced accordingly by using a second heat sink member 8L the height of which is reduced.

A plurality of heat release holes 8b (not shown) are cut in a side of the second heat sink member 8L. A flat top 8Lc of the second heat sink member 8L is exposed and the rest of the second heat sink member 8L is covered with the sealing resin 9.

As stated above, the height of the second heat sink member 8L can be reduced. As a result, a path to the flat top 8Lc of the second heat sink member 8L via the first heat sink member 32 where heat generated in the semiconductor element 5 is transmitted is shortened and a greater heat sink effect can be obtained.

In addition, by using the second heat sink member 8L the height of which is reduced in this way, the space between the semiconductor element 5 and the second heat sink member 8L becomes narrower and a path to the second heat sink member 8L via the surrounding sealing resin 9 where heat generated in the semiconductor element 5 is transmitted is shortened.

The procedure for fabricating the semiconductor device 130 differs from the procedure for fabricating the semiconductor device 100 according to the first embodiment of the present invention only in that the wiring board 31 where the depressed portion is formed, the first heat sink member 32 having the depressed portion, and the second heat sink member 8L of predetermined height are provided.

A semiconductor device according to a fourth embodiment of the present invention will now be described.

Figure 16:
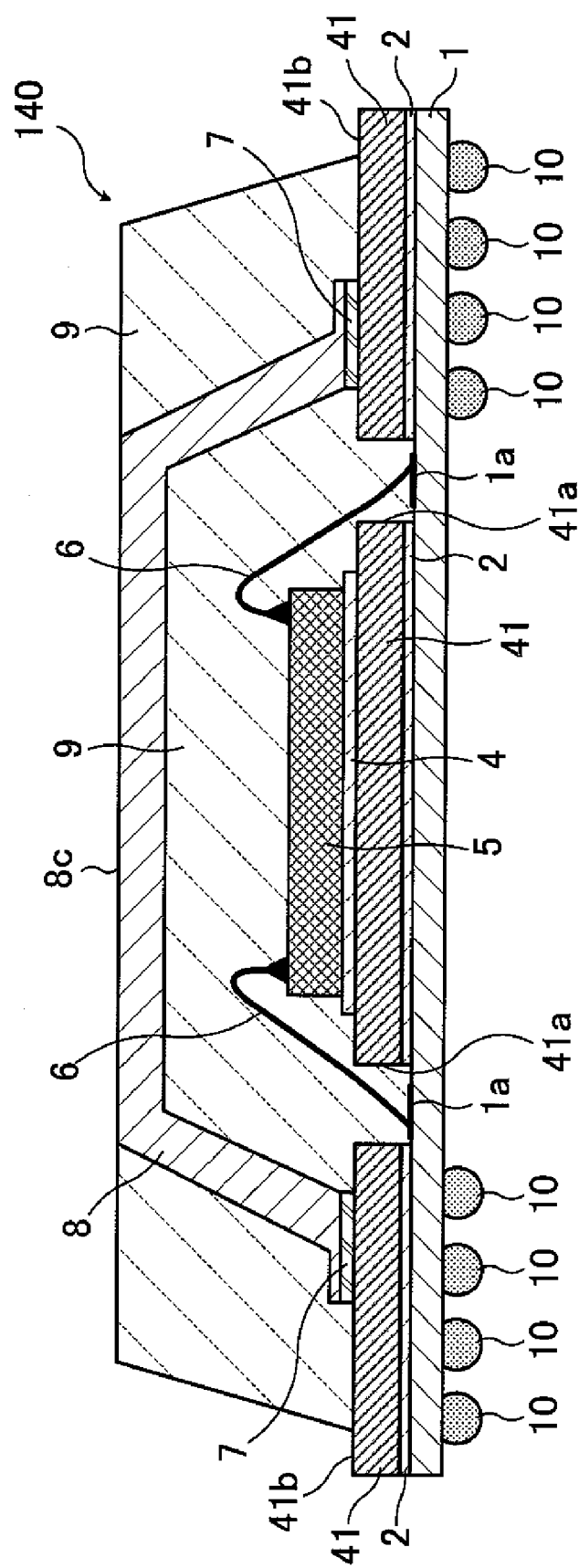
FIG. 16 is a schematic sectional view showing a semiconductor device according to a fourth embodiment of the present invention.

FIG. 16 shows the structure of a semiconductor device 140 according to a fourth embodiment of the present invention. Components in FIG. 16 that are the same as those shown in FIG. 1 are marked with the same symbols and detailed descriptions of them will be omitted.

With the semiconductor device 140, a thicker metal member is used as a first heat sink member 41.

The first heat sink member 41 has openings 41a in areas corresponding to terminals 1a located over a wiring board 1. An edge portion 41b of the first heat sink member 41 is not covered with a sealing resin 9 but is exposed. This is the same with the semiconductor device 100 according to the first embodiment of the present invention.

The thickness of the first heat sink member 41 is the same as that of a flat top 8c of a second heat sink member 8 and is, for example, 0.30 mm or more.

With the semiconductor device 140 having the above structure, efficiency in transmission of heat generated in a semiconductor element 5 in the first heat sink member 41 and efficiency in heat sink of heat from the edge portion 41b of the first heat sink member 41 can be enhanced.

The procedure for fabricating the above semiconductor device 140 differs from the procedure for fabricating the semiconductor device 100 according to the first embodiment of the present invention only in that the first heat sink member 41 with predetermined thickness is provided.

A semiconductor device according to a fifth embodiment of the present invention will now be described.

Figure 17:
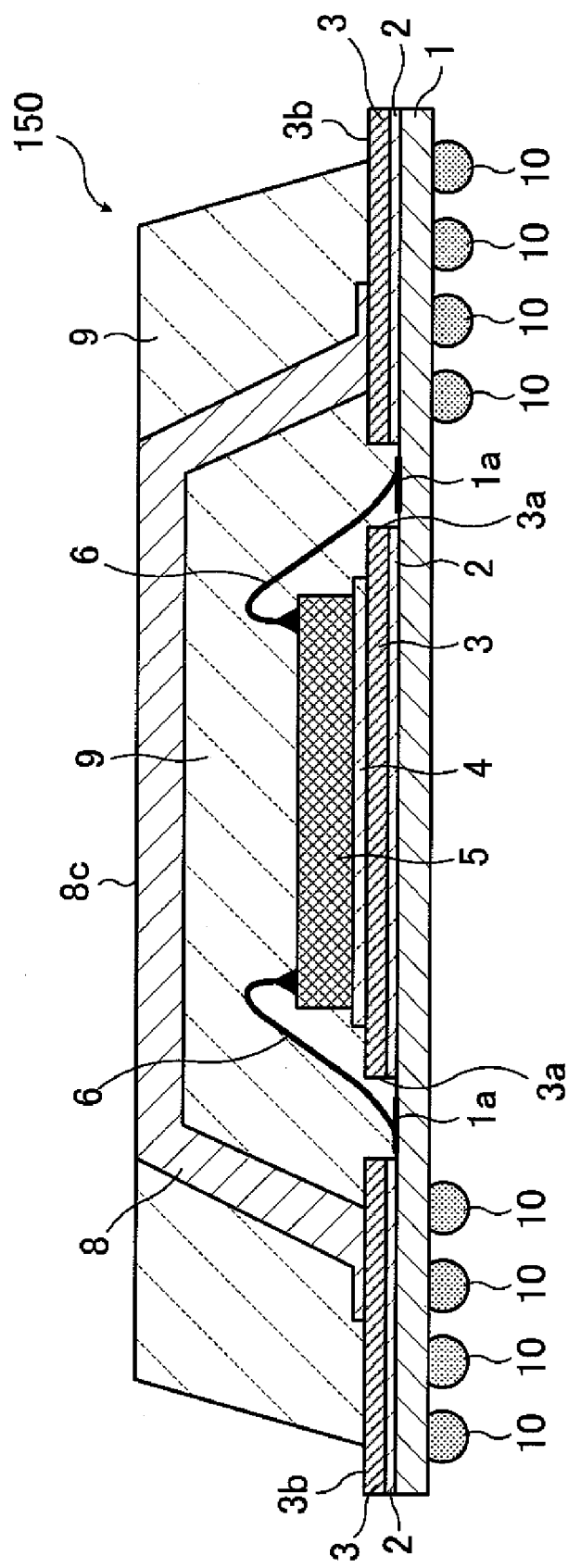
FIG. 17 is a schematic sectional view showing a semiconductor device according to a fifth embodiment of the present invention.

FIG. 17 shows the structure of a semiconductor device 150 according to a fifth embodiment of the present invention. Components in FIG. 17 that are the same as those shown in FIG. 1 are marked with the same symbols and detailed descriptions of them will be omitted.

With the semiconductor device 150, a first heat sink member 3 and a second heat sink member 8 are directly joined together by a welding method. In this case, a conductive adhesive material is not provided between the first heat sink member 3 and the second heat sink member 8.

The welding method is laser welding or the like.

By joining the first heat sink member 3 and the second heat sink member 8 together by the welding method, efficiency in transmission of heat between the first heat sink member 3 and the second heat sink member 8 can be improved further.

Moreover, the welding method is used, so trouble resulted from an adhesive does not occur. Therefore, the semiconductor device 150 with high reliability can be obtained.

The procedure for fabricating the semiconductor device 150 differs from the procedure for fabricating the semiconductor device 100 according to the first embodiment of the present invention only in that after a semiconductor element 5 located over the center of the first heat sink member 3 and terminals 1a are connected by bonding wires 6, the first heat sink member 3 and the second heat sink member 8 located thereon are joined together by the welding method.

A semiconductor device according to a sixth embodiment of the present invention will now be described.

Figure 18:
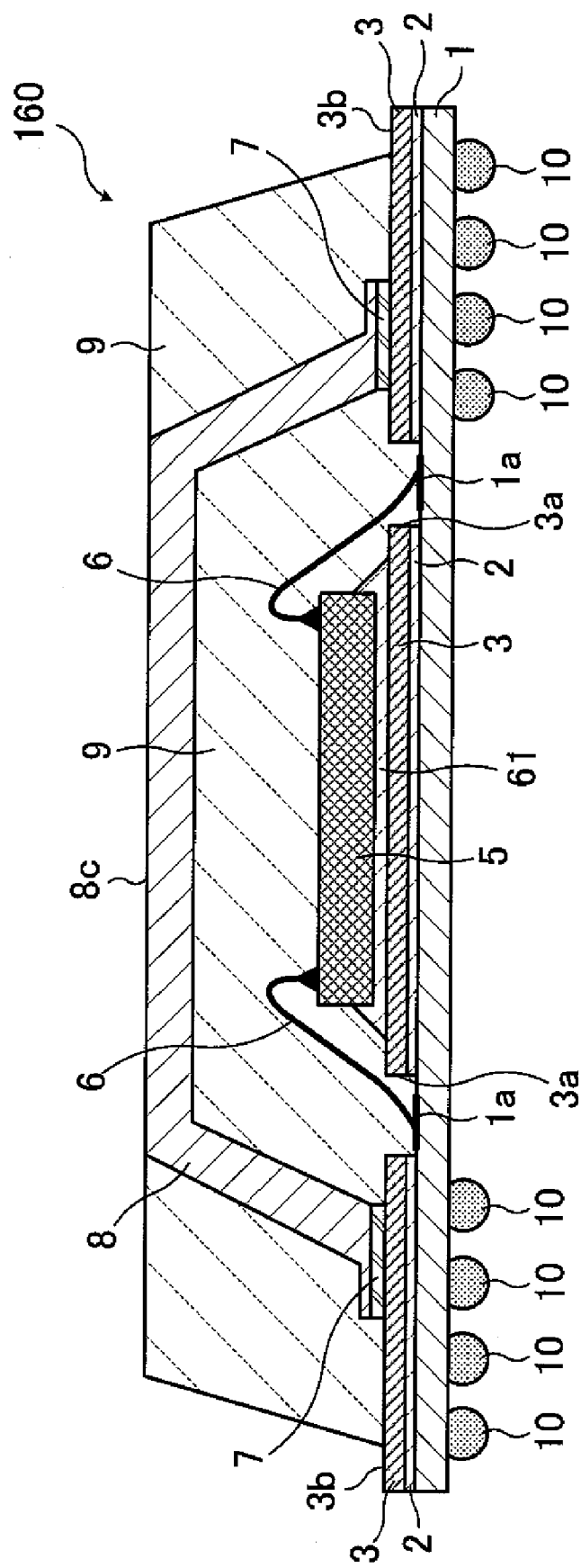
FIG. 18 is a schematic sectional view showing a semiconductor device according to a sixth embodiment of the present invention.

FIG. 18 shows the structure of a semiconductor device 160 according to a sixth embodiment of the present invention.

Components in FIG. 18 that are the same as those shown in FIG. 1 are marked with the same symbols and detailed descriptions of them will be omitted.

With the semiconductor device 160, a semiconductor element 5 is stuck over a first heat sink member 3 by using a conductive adhesive material 61.

Soldering paste, silver (Ag) paste, or the like can be used as the conductive adhesive material 61.

Compared with the case where an insulating adhesive material such as epoxy resin is used, efficiency in transmission of heat from the semiconductor element 5 to the first heat sink member 3 can be improved by gluing the semiconductor element 5 and the first heat sink member 3 together by using the conductive adhesive material 61.

The procedure for fabricating the above semiconductor device 160 differs from the procedure for fabricating the semiconductor device 100 according to the first embodiment of the present invention only in that the conductive adhesive material 61 is used in the process for sticking the semiconductor element (mounting the semiconductor element over a heat sink member).

A semiconductor device according to a seventh embodiment of the present invention will now be described.

Figure 19:
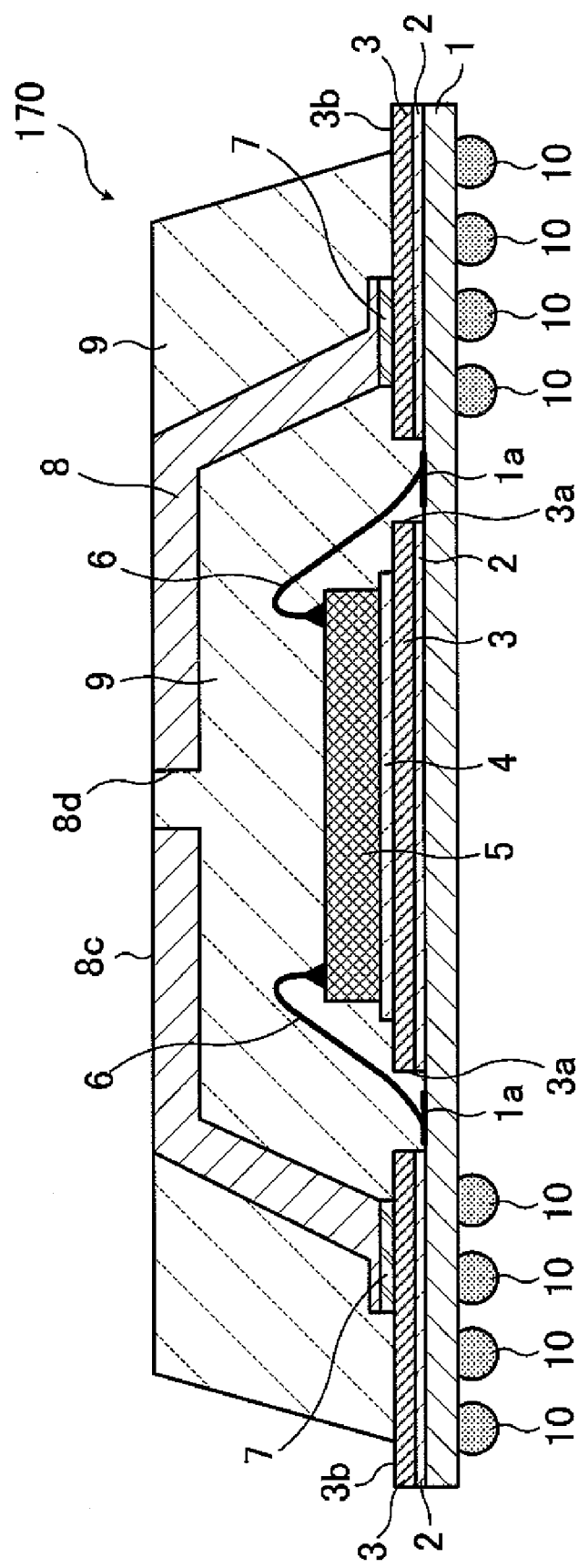
FIG. 19 is a schematic sectional view showing a semiconductor device according to a seventh embodiment of the present invention.

FIG. 19 shows the structure of a semiconductor device 170 according to a seventh embodiment of the present invention. Components in FIG. 19 that are the same as those shown in FIG. 1 are marked with the same symbols and detailed descriptions of them will be omitted.

With the semiconductor device 170, a heat release hole (VD hole) 8d is cut in a second heat sink member 8. The heat release hole 8d pierces the second heat sink member 8 from a flat top 8c to an inner space. Heat release holes (not shown) used for pouring a sealing resin 9 into the inside are cut in the second heat sink member 8. This is the same with the semiconductor device 100 according to the first embodiment of the present invention. The flat top 8c of the second heat sink member 8 is exposed and the rest of the second heat sink member 8 is covered with the sealing resin 9.

With the semiconductor device 170 having the above structure, moisture and the like contained in the sealing resin 9 inside the second heat sink member 8, adhesive materials 2 and 4, and a wiring board 1 can be discharged to the outside through the heat release hole 8d. Moreover, by cutting the heat release hole 8d, the area of the contact of the second heat sink member 8 with the sealing resin 9 increases, adhesion between the second heat sink member 8 and the sealing resin 9 increases, and the heat resistance of the semiconductor device 170 can be improved.

In addition, cutting the heat release hole 8d can relieve stresses created in the second heat sink member 8 and effectively prevent the wiring board 1 and/or the semiconductor device 170 from warping.

The procedure for fabricating the above semiconductor device 170 differs from the procedure for fabricating the semiconductor device 100 according to the first embodiment of the present invention only in that the heat release hole 8d is cut in advance in the second heat sink member 8. The position and number of the heat release hole (VD hole) 8d are not limited to those shown in FIG. 19.

A semiconductor device according to an eighth embodiment of the present invention will now be described.

Figure 20:
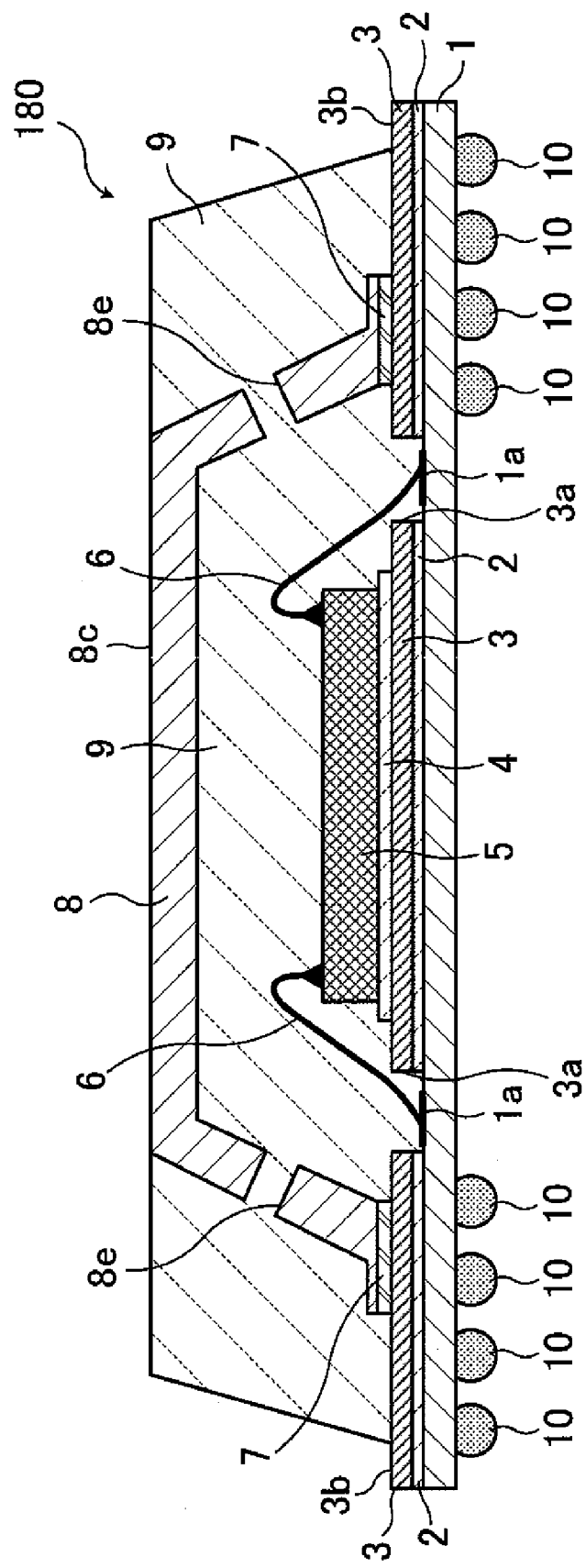
FIG. 20 is a schematic sectional view showing a semiconductor device according to an eighth embodiment of the present invention.
Figure 21:
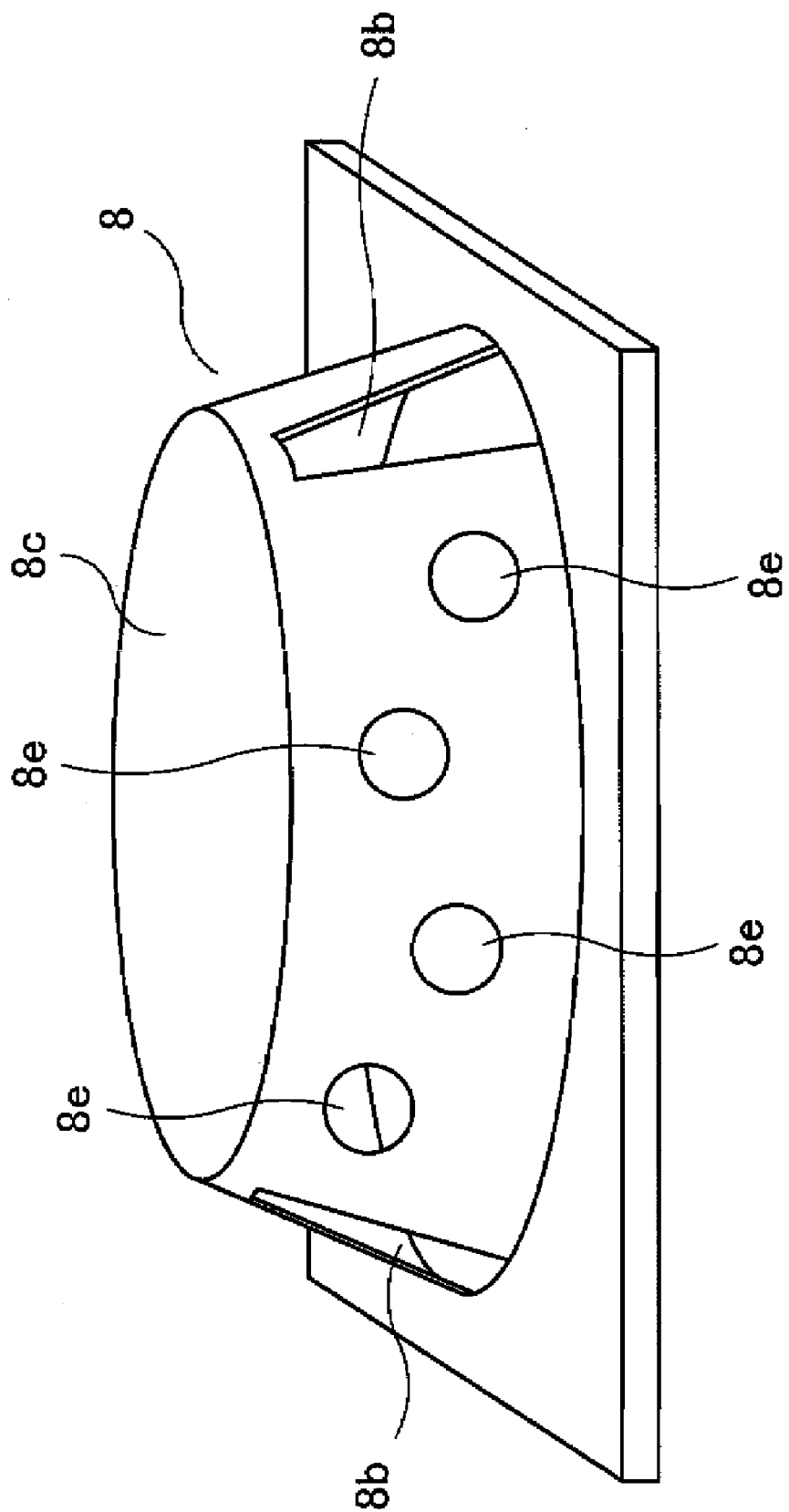
FIG. 21 is a schematic perspective view showing a second heat sink member applied to the semiconductor device according to the eighth embodiment of the present invention.

FIG. 20 shows the structure of a semiconductor device 180 according to an eighth embodiment of the present invention. Components in FIG. 20 that are the same as those shown in FIG. 1 are marked with the same symbols and detailed descriptions of them will be omitted. FIG. 21 shows a second heat sink member included in the semiconductor device 180 according to the eighth embodiment of the present invention.

With the semiconductor device 180, not only heat release holes 8b used for pouring a sealing resin 9 but also a plurality of anchor holes 8e are cut in a side wall of the second heat sink member 8.

A flat top 8c of the second heat sink member 8 is exposed and the rest of the second heat sink member 8 is covered with the sealing resin 9. This is the same with the semiconductor device 100 according to the first embodiment of the present invention.

With the semiconductor device 180 having the above structure, the plurality of anchor holes 8e are cut in the side wall of the second heat sink member 8, so the area of the contact of the second heat sink member 8 with the sealing resin 9 increases. As a result, adhesion between the second heat sink member 8 and the sealing resin 9 increases and the heat resistance of the semiconductor device 180 can be improved.

In addition, cutting the plurality of anchor holes Be can relieve stresses created in the second heat sink member 8. Moreover, a first heat sink member 3 and the second heat sink member 8 effectively prevent a wiring board 1 and/or the semiconductor device 180 from warping.

The procedure for fabricating the above semiconductor device 180 differs from the procedure for fabricating the semiconductor device 100 according to the first embodiment of the present invention only in that the plurality of anchor holes 8e are cut in advance in the second heat sink member 8. The positions and number of the plurality of anchor holes 8e cut in the second heat sink member 8 are not limited to those shown in FIGS. 20 and 21.

A semiconductor device according to a ninth embodiment of the present invention will now be described.

Figure 22:
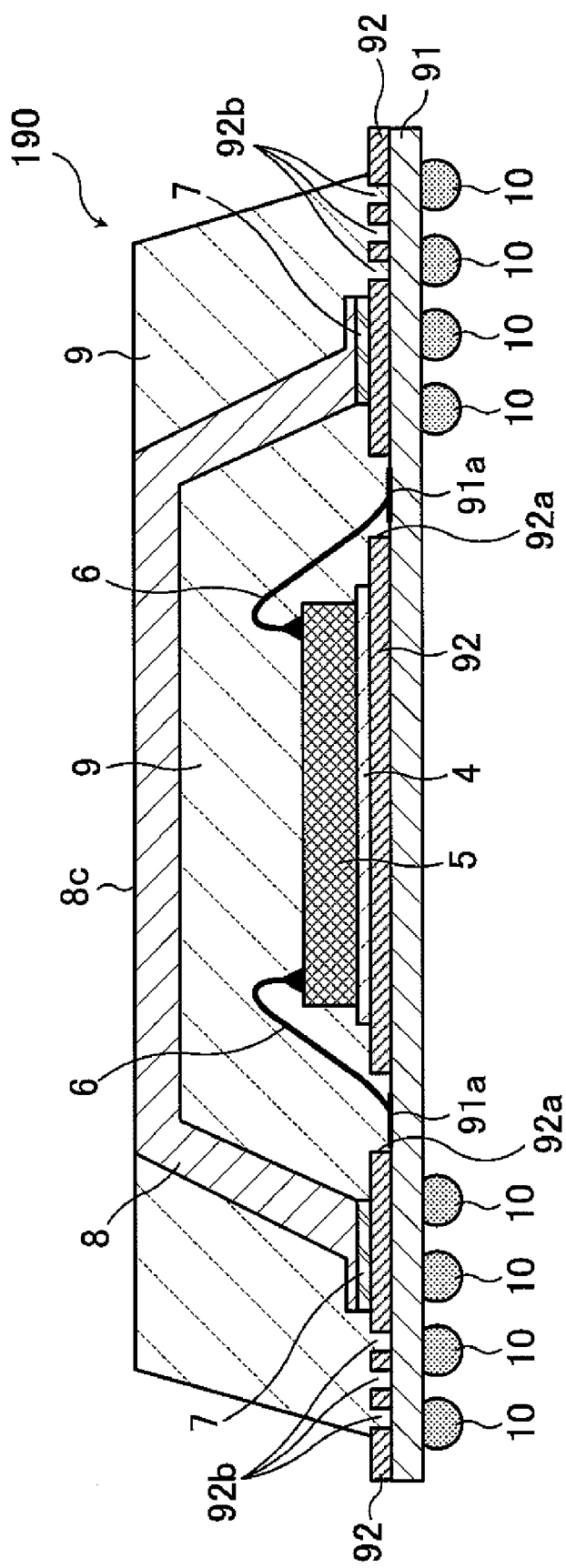
FIG. 22 is a schematic sectional view showing a semiconductor device according to a ninth embodiment of the present invention.

FIG. 22 shows the structure of a semiconductor device 190 according to a ninth embodiment of the present invention. Components in FIG. 22 that are the same as those shown in FIG. 1 are marked with the same symbols and detailed descriptions of them will be omitted.

With the semiconductor device 190, not only openings 92a for exposing terminals 91a located over a wiring board 91 but also a plurality of anchor holes 92b are cut in a first heat sink member 92 located over the wiring board 91.

Moreover, the wiring board 91 and the first heat sink member 92 are joined together by, for example, the laser welding method. In this case, an adhesive material is not between the wiring board 91 and the first heat sink member 92.

With the semiconductor device 190 having the above structure, the plurality of anchor holes 92b are cut in the first heat sink member 92, so a sealing resin 9 touches the wiring board 91 in the plurality of anchor holes 92b.

Therefore, the area of contact of the sealing resin 9 with the wiring board 91 and the first heat sink member 92 increases and the moisture and heat resistance of the semiconductor device 190 can be improved.

Furthermore, an adhesive material is not between the wiring board 91 and the first heat sink member 92. Therefore, trouble resulting from an adhesive material does not occur and the semiconductor device 190 with high reliability can be obtained.

Figure 23A:
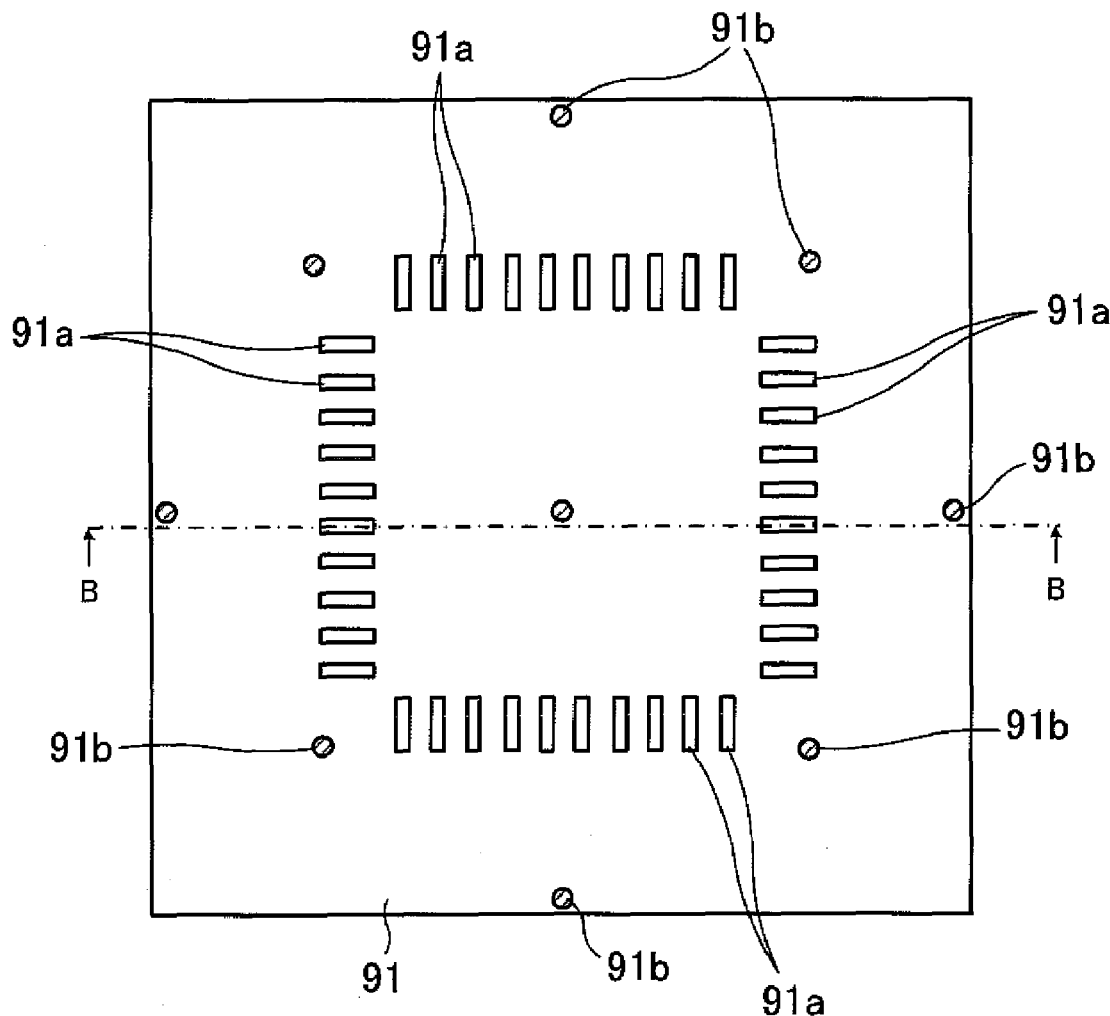
FIG. 23A is a schematic plan view showing a wiring board applied to the semiconductor device according to the ninth embodiment of the present invention.
Figure 23B:
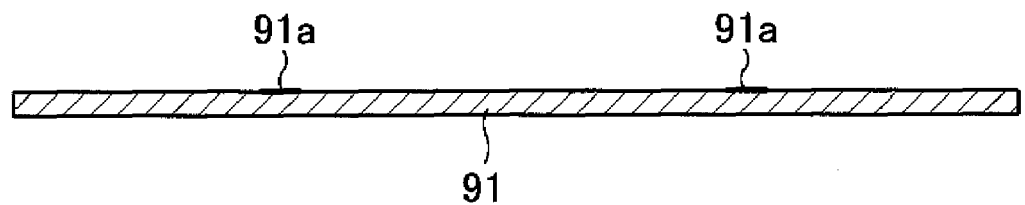
FIG. 23B is a schematic sectional view showing the wiring board applied to the semiconductor device according to the ninth embodiment of the present invention.
Figure 24A:
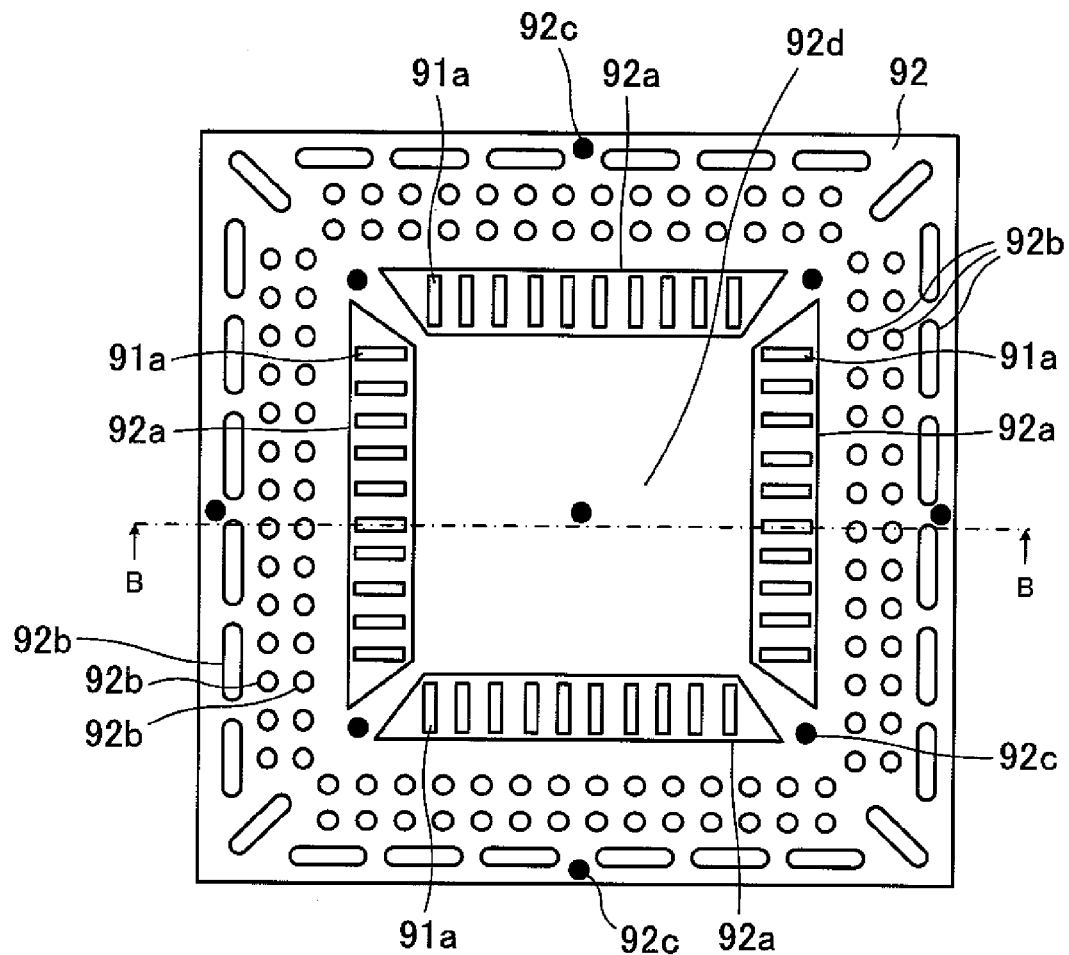
FIG. 24A is a schematic plan view showing a state in which a first heat sink member is located over the wiring board.
Figure 24B:
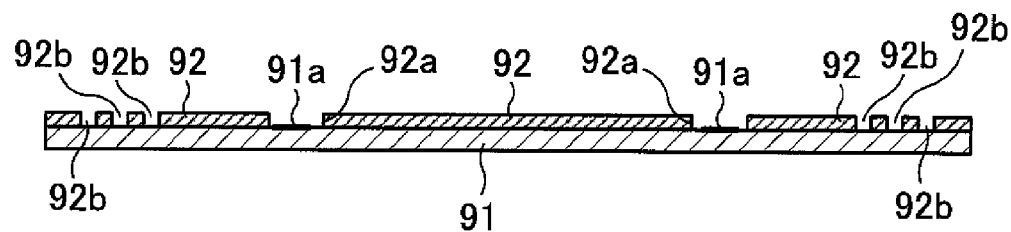
FIG. 24B is a schematic sectional view showing the state in which the first heat sink member is located over the wiring board.
Figure 25A:
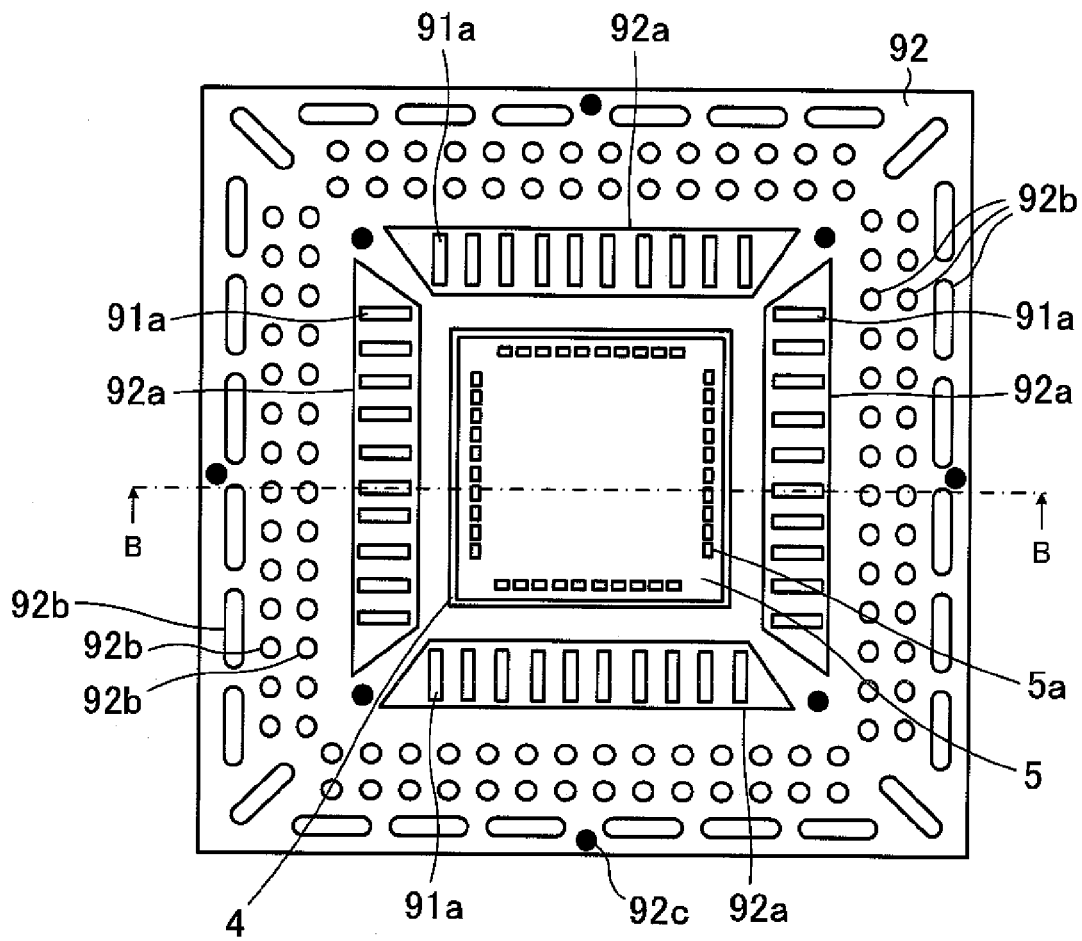
FIG. 25A is a schematic plan view showing a state in which a semiconductor element is stuck over the first heat sink member.
Figure 25B:
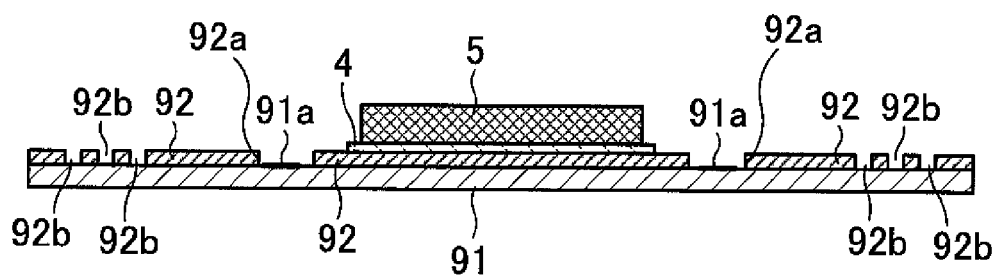
FIG. 25B is a schematic sectional view showing the state in which the semiconductor element is stuck over the first heat sink member.
Figure 26A:
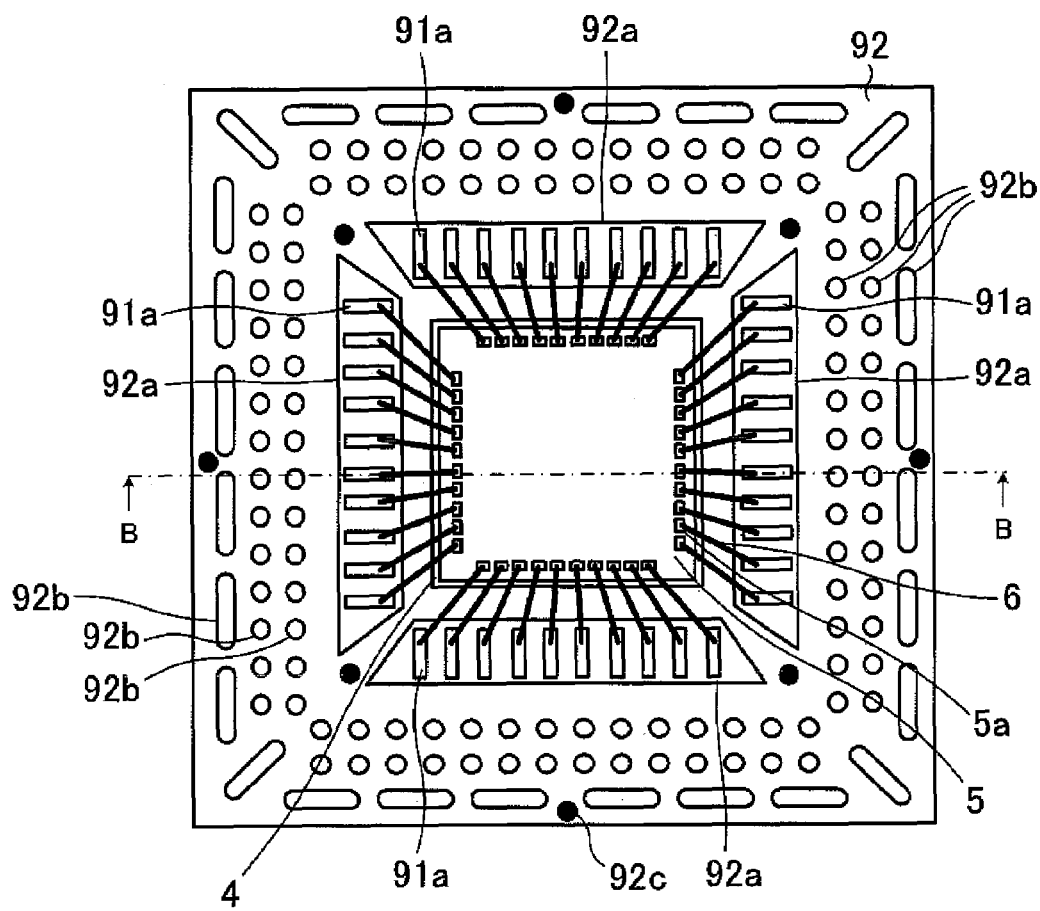
FIG. 26A is a schematic plan view showing the state of wire bonding performed on the semiconductor element.
Figure 26B:
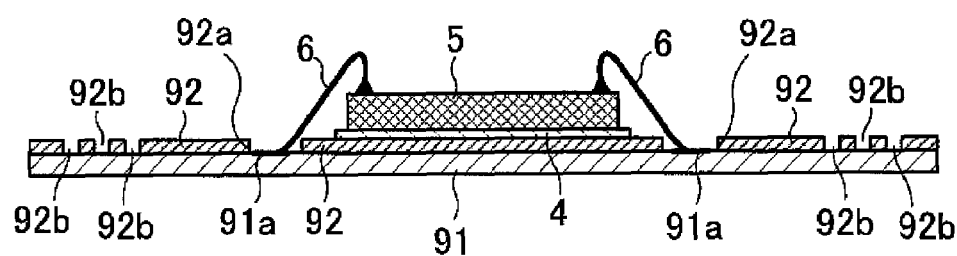
FIG. 26B is a schematic sectional view showing the state of the wire bonding performed on the semiconductor element.
Figure 27A:
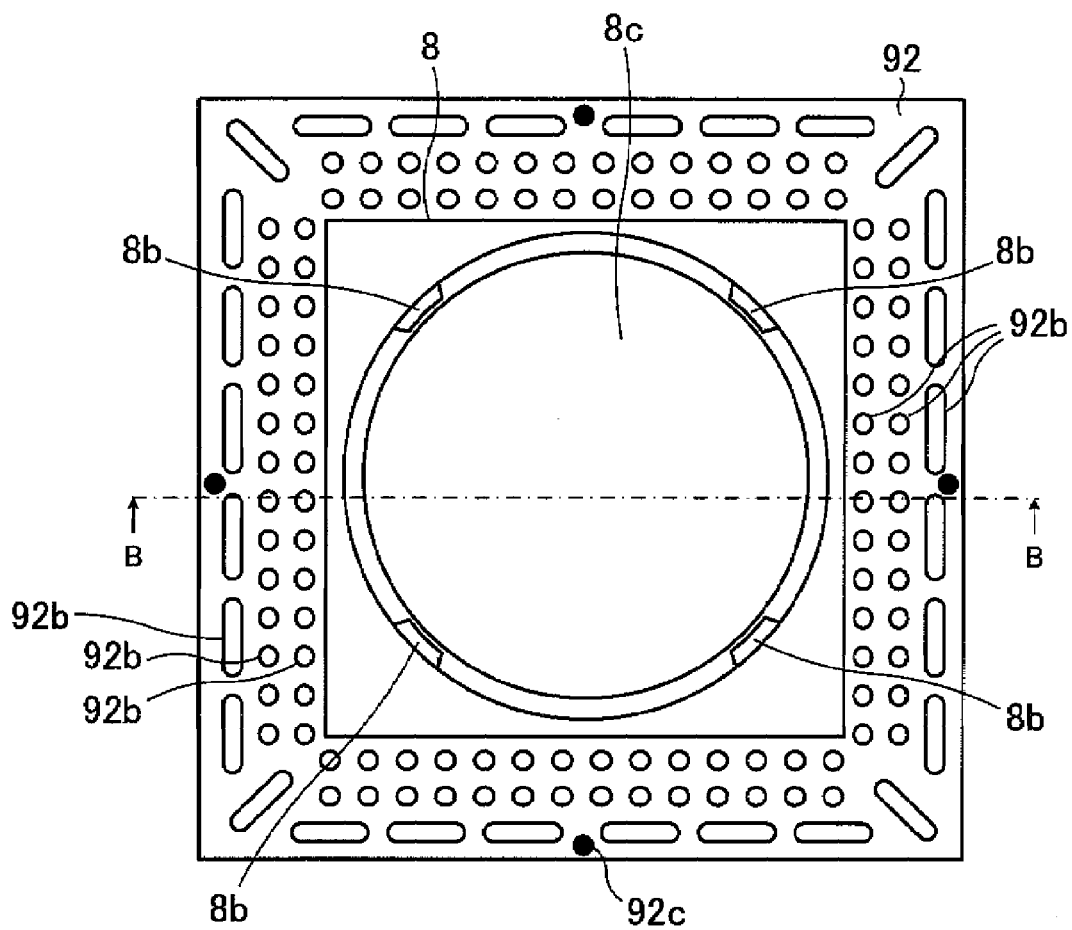
FIG. 27A is a schematic plan view showing a state in which a second heat sink member is located.
Figure 27B:
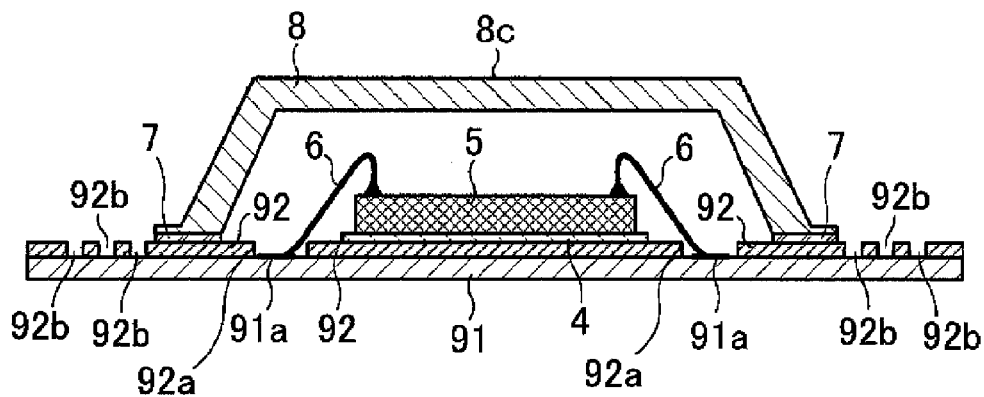
FIG. 27B is a schematic sectional view showing the state in which the second heat sink member is located.
Figure 28A:
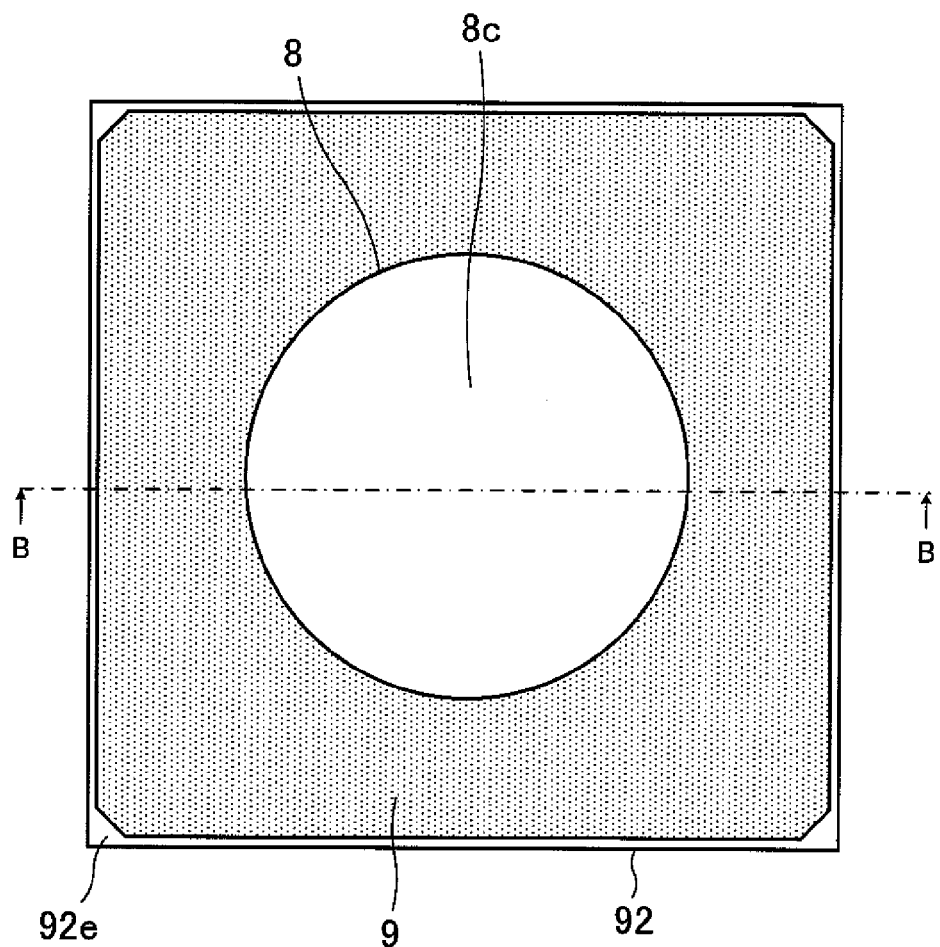
FIG. 28A is a schematic plan view showing a resin sealing structure of the semiconductor device according to the ninth embodiment of the present invention and FIG. 28B is a schematic sectional view showing the resin sealing structure of the semiconductor device according to the ninth embodiment of the present invention.
Figure 28B:
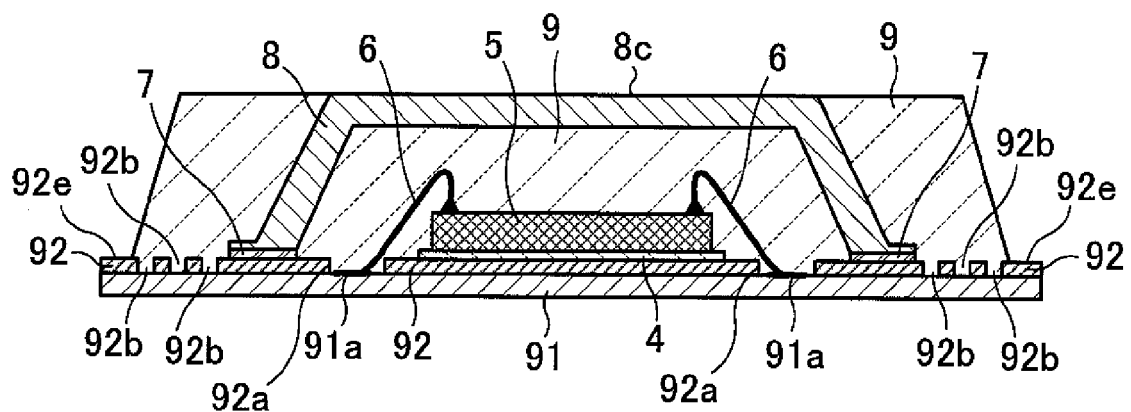

A method for fabricating the semiconductor device 190 according to the ninth embodiment of the present invention will now be described by using the drawings. FIGS. 23 through 28 give an overview of processes for fabricating the semiconductor device 190. Each of FIGS. 23A, 24A, 25A, 26A, 27A, and 28A schematically shows the shape from above of the semiconductor device 190. FIG. 23B schematically shows a section along lines B-B of FIG. 23A. The same applies to FIGS. 24B, 25B, 26B, 27B, and 28B.

The wiring board 91 shown in FIG. 23 is provided first. The plurality of terminals 91a connected to electrodes of a semiconductor element 5 are formed over the wiring board 91. A plurality of (nine, in this example) metal joints 91b used in a later process for connecting (temporarily fixing) the first heat sink member 92 by the laser welding are located over the wiring board 91.

The first heat sink member 92 is then placed over one surface of the wiring board 91. Laser irradiation points 92c of the first heat sink member 92 are irradiated with laser beams to integrate the laser irradiation points 92c of the first heat sink member 92 with the metal joints 91b of the wiring board 91. As a result, the first heat sink member 92 is temporarily fixed over the wiring board 91.

In addition to the above laser irradiation points 92c, as shown in FIG. 24, the openings 92a and the anchor holes 92b are cut in advance in the first heat sink member 92. The openings 92a are cut so as to expose the terminals 91a located over the wiring board 91.

The semiconductor element 5 is then placed and stuck over an area 92d inside the openings 92a of the first heat sink member 92 with an adhesive material 4 which is a sheet adhesive, such as a die bonding film, or a paste adhesive therebetween. FIG. 25 shows this state.

Electrode pads 5a of the semiconductor element 5 and the terminals 91a of the wiring board 91 are then connected by bonding wires 6. FIG. 26 shows this state.

A second heat sink member 8 is then located so as to cover the semiconductor element 5. The second heat sink member 8 is stuck over the first heat sink member 92 by the use of a conductive adhesive material 7 such as soldering paste. FIG. 27 shows this state.

The welding method may be used for integrating the second heat sink member 8 with the first heat sink member 92.

Hermetic seal (resin sealing) treatment is then performed on the inside and outside of the second heat sink member 8 by using the sealing resin 9.

When the resin sealing treatment is performed, the sealing resin 9 pours into space inside the second heat sink member 8 through heat release holes 8b cut in the second heat sink member 8 and the semiconductor element 5, together with the bonding wires 6, is sealed by the sealing resin 9.

The second heat sink member 8 is sealed in a state in which a flat top 8c of the second heat sink member 8 is exposed.

When the resin sealing treatment is performed, the first heat sink member 92 is covered with the sealing resin 9 so that an edge portion 92e of the first heat sink member 92 will be exposed. FIG. 28 shows this state.

At this time the sealing resin 9 also pours into the anchor holes 92b cut in the first heat sink member 92 and the laser irradiation points 92c of the first heat sink member 92. As a result, the first heat sink member 92 is integrated with the wiring board 91 more firmly.

Solder balls are then located on or under electrode pads located at predetermined positions of the other surface (reverse) of the wiring board 91 as external connection terminals 10. By doing so, the semiconductor device 190 is fabricated.

A semiconductor device according to a tenth embodiment of the present invention will now be described.

Figure 29:
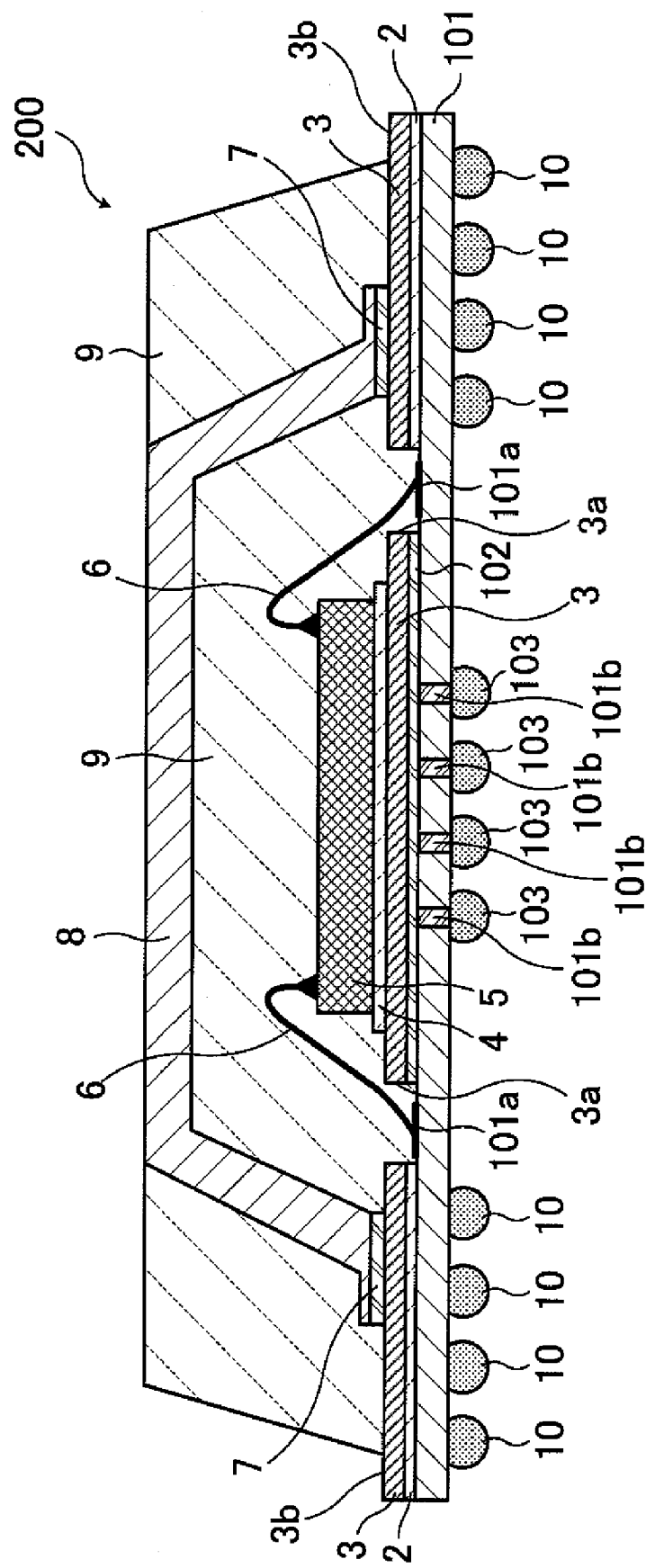
FIG. 29 is a schematic sectional view showing a semiconductor device according to a tenth embodiment of the present invention.

FIG. 29 shows the structure of a semiconductor device 200 according to a tenth embodiment of the present invention. Components in FIG. 29 that are the same as those shown in FIG. 1 are marked with the same symbols and detailed descriptions of them will be omitted.

With the semiconductor device 200, a plurality of heat sink heat release holes (thermal vias) 101b are cut in an area of a wiring board 101 right under a semiconductor element 5 stuck over a first heat sink member 3.

The plurality of heat sink heat release holes 101b are formed by filling heat release holes cut in the wiring board 101 with a conductive material, such as solder, or by coating inner surfaces of the heat release holes with metal, such as copper (Cu)

One end of each heat sink heat release hole 101b is connected to the first heat sink member 3 via a conductive adhesive material 102 and the other end of each heat sink heat release hole 101b is connected to a heat sink terminal (thermal ball) 103.

With the semiconductor device 200 having the above structure, heat which is generated in the semiconductor element 5 and which is transmitted to the first heat sink member 3 is transmitted to the heat sink heat release holes 101b and the thermal balls 103 via the conductive adhesive material 102 and is released to other components, such as a mother board where the semiconductor device 200 is mounted, which the thermal balls 103 are touching.

The heat transmitted from the semiconductor element 5 to the first heat sink member 3 is also transmitted to an exposed edge portion 3b not covered with a sealing resin 9 and/or a second heat sink member 8 and is released to the outside.

By locating the conductive adhesive material 102, the heat sink heat release holes (thermal vias) 101b, and the thermal balls 103 in this way, efficiency in heat sink of heat from the semiconductor device 200 can be improved.

The positions and number of the heat sink heat release holes (thermal vias) 101b are not limited to those shown in FIG. 29. Similarly, the positions and number of the thermal balls 103 are not limited to those shown in FIG. 29.

A semiconductor device according to an eleventh embodiment of the present invention will now be described.

Figure 30:
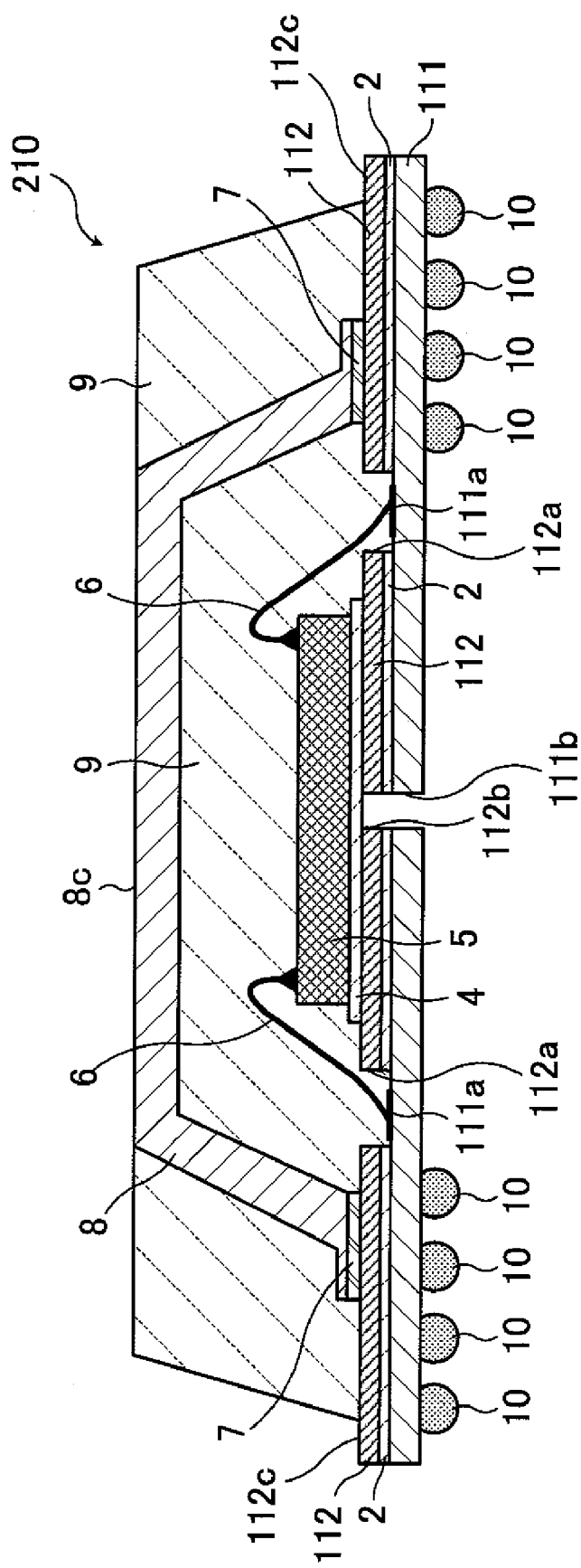
FIG. 30 is a schematic sectional view showing a semiconductor device according to an eleventh embodiment of the present invention.
Figure 37A:
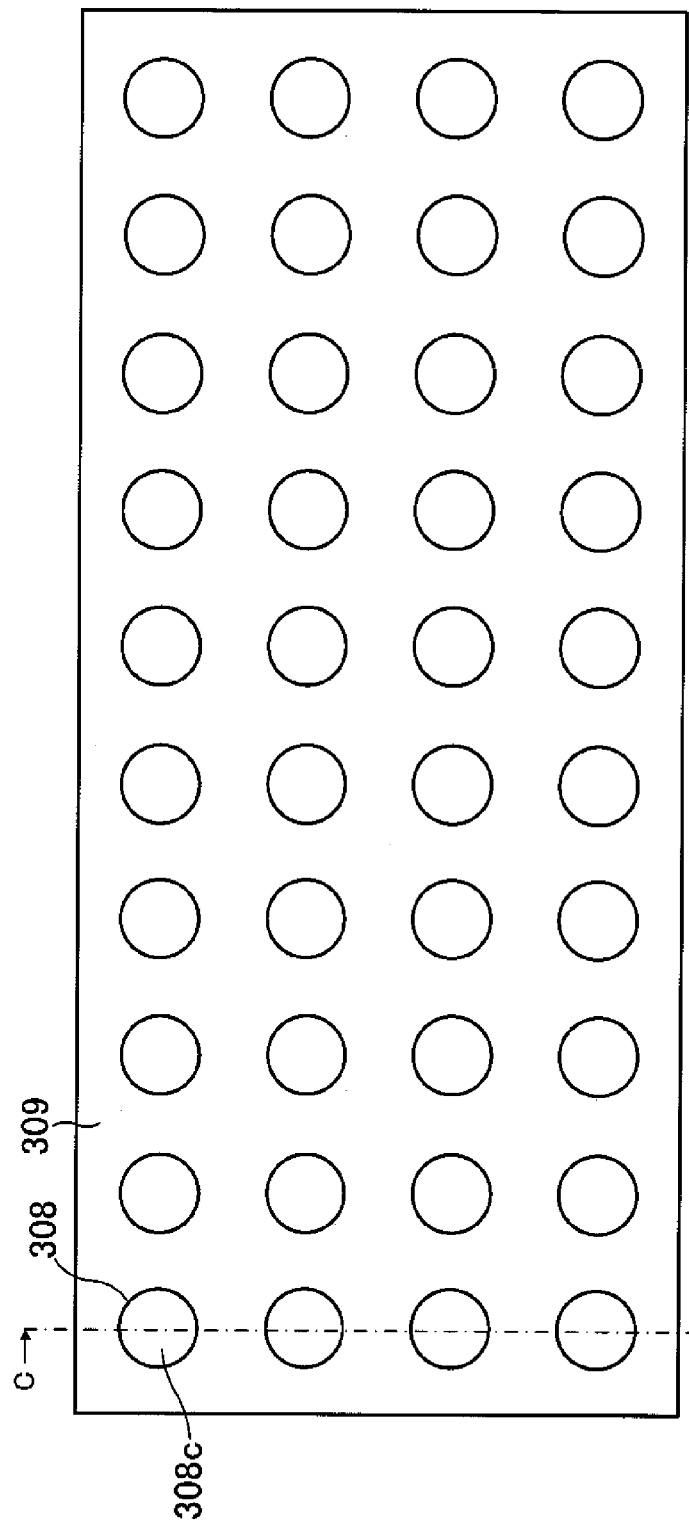
FIG. 37A is a schematic plan view showing a resin sealing structure of the semiconductor device according to the twelfth embodiment of the present invention and FIG. 37B is a schematic sectional view showing the resin sealing structure of the semiconductor device according to the twelfth embodiment of the present invention.
Figure 37B:
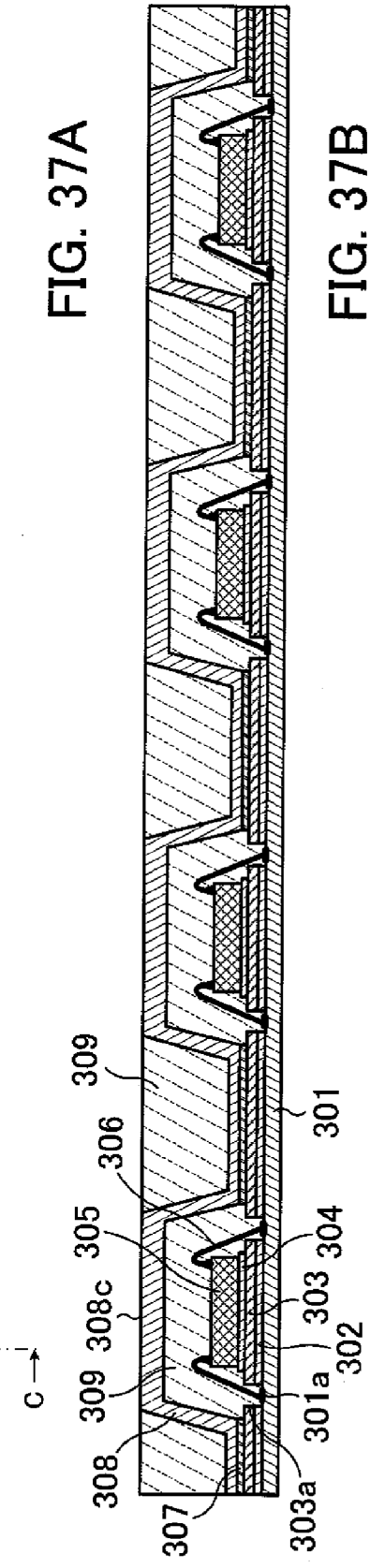
Figures 39A, 39B:
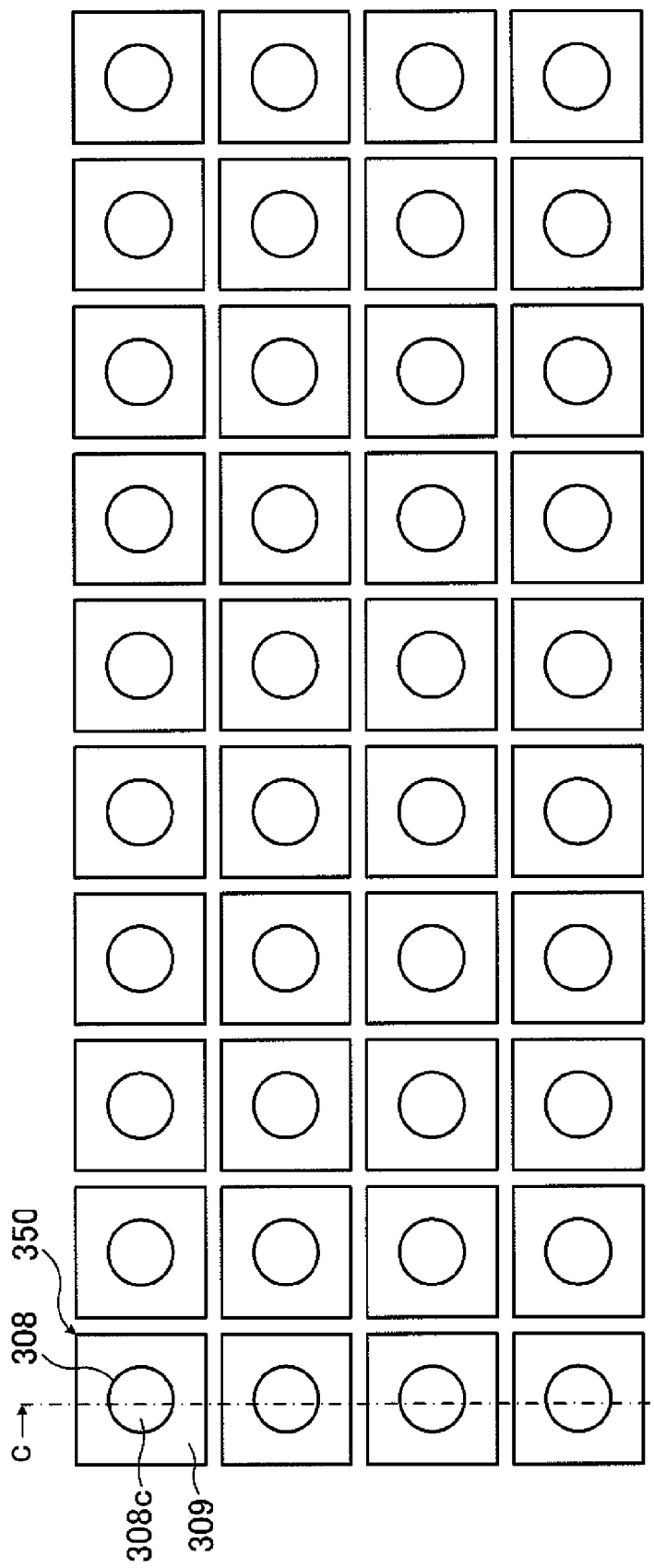
FIG. 39A is a schematic plan view showing a dicing process performed for fabricating the semiconductor device according to the twelfth embodiment of the present invention.
FIG. 39B is a schematic sectional view showing the dicing process performed for fabricating the semiconductor device according to the twelfth embodiment of the present invention.
Figure 40A:
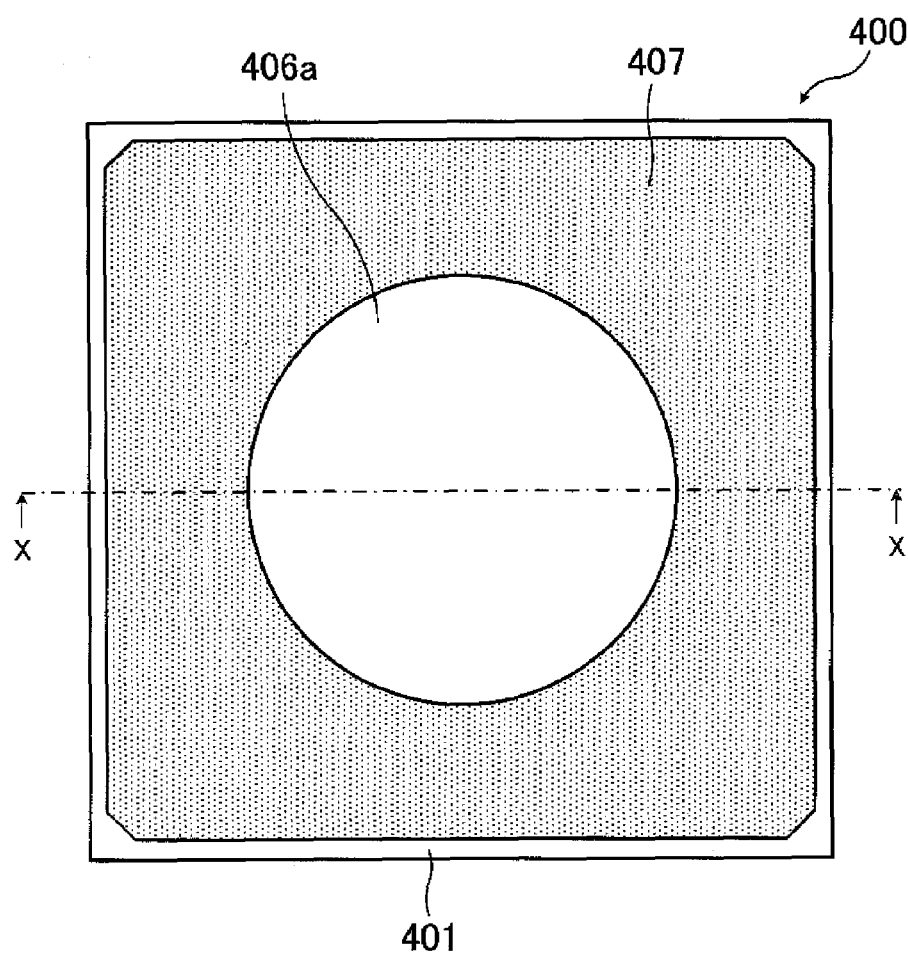
FIG. 40A is a schematic plan view showing an example of a conventional semiconductor device and FIG. 40B is a schematic sectional view showing the example of a conventional semiconductor device.
Figure 40B:
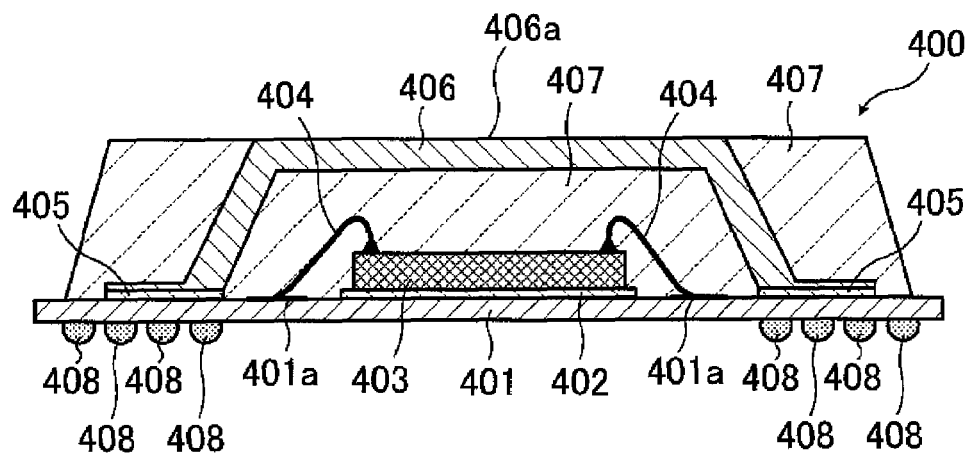

FIG. 30 shows the structure of a semiconductor device 210 according to an eleventh embodiment of the present invention. Components in FIG. 30 that are the same as those shown in FIG. 1 are marked with the same symbols and detailed descriptions of them will be omitted.

With the semiconductor device 210, heat release holes (VD holes) 112b and 111b are cut in areas of a first heat sink member 112 and a wiring board 111, respectively, right under a semiconductor element 5 mounted. The heat release holes 112b and 111b connect.

The first heat sink member 112 has openings 112a in areas corresponding to terminals 111a located over the wiring board 111. An edge portion 112c of the first heat sink member 112 is not covered with the sealing resin 9 and is exposed.

With the semiconductor device 210 having the above structure, moisture contained in the sealing resin 9 inside the second heat sink member 8, adhesive materials 2 and 4, and the wiring board 111 itself can be discharged to the outside through the heat release hole 111b and 112b.

By discharging the moisture through the heat release holes 111b and 112b, the moisture resistance of the semiconductor device 210 can be improved.

Part of heat which is generated in the semiconductor element 5 and which is transmitted to the first heat sink member 112 is released from the heat release holes 111b and 112b cut in the wiring board 111 and the first heat sink member 112, respectively, to the outside of the semiconductor device 210.

In addition, the heat which is transmitted from the semiconductor element 5 to the first heat sink member 112 is transmitted to the exposed edge portion 112c not covered with the sealing resin 9 and the second heat sink member 8 and is released to the outside of the semiconductor device 210.

The position and number of the heat release hole (VD hole) 111b are not limited to those shown in FIG. 30. Similarly, the position and number of the heat release hole (VD hole) 112b are not limited to those shown in FIG. 30.

A twelfth embodiment of the present invention will now be described.

In this embodiment, a plurality of semiconductor devices are formed on one board and the plurality of semiconductor devices are finally obtained by dicing.

A process for fabricating such a semiconductor device will be described by using FIGS. 31 through 39. Each of FIGS. 31A, 32A, 33A, 34A, 35A, 36A, 37A, 38A, and 39A schematically shows the shape from above of a semiconductor device. FIG. 31B schematically shows a section along lines C-C of FIG. 31A. The same applies to FIGS. 32B, 33B, 34B, 35B, 36B, 37B, 38B, and 39B.

In this embodiment, a large-sized board where a plurality of semiconductor element mounting portions are arranged like what is called a matrix is used. FIG. 31 shows the large-sized board.

Forty semiconductor element mounting portions are arranged on the large-sized board 301 like a matrix. A terminal 301a is located over each semiconductor element mounting portion.

The large-sized board 301 is laminated and has what is called a multilayer wiring layer structure. That is to say, the large-sized board 301 includes a plurality of insulating substrates made of glass epoxy resin or the like. Wiring layers made of metal, such as copper (Cu), are formed on and in the large-sized board 301. The terminals 301a are located over a surface (one surface) of the large-sized board 301 where each semiconductor element and each first heat sink member are to be located, and electrodes for locating external connection terminals are located on or under the reverse (other surface) of the large-sized board 301.

There may be no need for the large-sized board 301 to have a multilayer wiring layer structure, depending on the structure, function, or scale of each semiconductor element.

An adhesive material 302 which is a liquid or film adhesive is then located selectively over the one surface except the terminals 301a of the large-sized board 301 so as to form openings corresponding to the terminals 301a in the adhesive material 302. FIG. 32 shows this state.

A first heat sink member 303 made of a copper (Cu) or aluminum (Al) plate is then stuck over the large-sized board 301 with the adhesive material 302 therebetween. That is to say, the first heat sink member 303 is stuck over the large-sized board 301 by the adhesive material 302. FIG. 33 shows this state.

Openings 303a corresponding to the terminals 301a of the plurality of semiconductor elements are formed in advance in the first heat sink member 303. Each area 303b almost all of which is surrounded by the openings 303a is a semiconductor element mounting portion. The thickness of the first heat sink member 303 is selected with heat sink of heat and the influence on the large-sized board 301 taken into consideration.

A semiconductor element 305 is then placed and stuck in each of the plurality of semiconductor element mounting portions over the first heat sink member 303 with an adhesive material 304, such as a die bonding film, therebetween. FIG. 34 shows this state.

Electrode pads 305a of the semiconductor element 305 and the terminals 301a located over the large-sized board 301 are then connected by bonding wires 306 made of gold (Au). This wire connection process is performed on all of the plurality of semiconductor elements 305 mounted over the large-sized board 301 with the first heat sink member 303 therebetween. FIG. 35 shows this state.

A second heat sink member 308 where a plurality of dome-like projections each having space a section of which is trapezoidal according to the semiconductor element 305 are formed is then placed and stuck over the first heat sink member 303 with an adhesive material 307 therebetween.

The shape and size of each dome-like projection that is formed on the second heat sink member 308 and that has space a section of which is trapezoidal are set so that it will be separate from the semiconductor element 305 and the bonding wires 306 drawn out therefrom and so that it will cover the semiconductor element 305 and the bonding wires 306 drawn out therefrom. FIG. 36 shows this state.

A plurality of heat release holes 308b are cut in a side of each dome-like projection that is formed on the second heat sink member 308 and that has space a section of which is trapezoidal.

After that, the large-sized board 301 over the one surface of which the first heat sink member 303, the semiconductor elements 305, the second heat sink member 308, and the like are stuck in this way is mounted on a resin molding treatment unit and resin molding treatment is performed on the one surface of the large-sized board 301.

In this case, a well-known transfer molding method or compression molding method can be used as a molding treatment method. Moreover, an epoxy resin is used as a sealing resin.

By performing the above molding treatment, the semiconductor elements 305 located over the first heat sink member 303 are sealed by resin 309 poured through the plurality of heat release holes 308b cut in the second heat sink member 308.

Each dome-like projection that is formed on the second heat sink member 308 and that has space a section of which is trapezoidal is covered with the resin 309 in a state in which a flat top 308c is exposed.

A space between adjacent dome-like projections each having space a section of which is trapezoidal is filled with the resin 309. FIG. 37 shows this state.

Solder balls are then located on or under the electrodes located on or under the other surface of the large-sized board 301, that is to say, on or under the surface opposite to the resin-molded surface of the large-sized board 301 as external connection terminals 310. FIG. 38 shows this state.

After that, the resin-molded portions (portions filled with the resin 309), the heat sink members, the board, and the like are cut in the direction of the thickness (direction in which layers are piled) to separate (dice) them into individual semiconductor devices 350.

The edges of the first heat sink member 303 and the second heat sink member 308 are exposed on the sides of each semiconductor device 350 obtained by the cutting. FIG. 39 shows this state.

A cutting method can properly be selected. For example, a dicing blade or laser beams are used.

As has been described in the foregoing, with the semiconductor device according to the present invention the first heat sink member is located over the wiring board, the semiconductor element is located over the first heat sink member, and the second heat sink member is located so as to cover the semiconductor element. The second heat sink member can thermally be connected to the first heat sink member.

By locating the heat sink members in this way, heat generated in the semiconductor element is effectively transmitted to the first heat sink member and the second heat sink member and is efficiently released to the outside.

In the above embodiments of the present invention the inside and outside of the second heat sink member is sealed or covered with the sealing resin. However, only the inside of the second heat sink member may be sealed with the sealing resin.

By doing so, the whole of the outer surface of the second heat sink member is exposed and efficiency in heat sink of heat can be increased further. Moreover, the heat release holes 8d and 8e cut in the second heat sink member 8 are not necessarily used separately. The heat release holes 8d and 8e may be used together as occasion demands.

In the present invention the semiconductor element is located over the first heat sink member located over the board, and the second heat sink member which covers the semiconductor element is located so as to thermally connect with the first heat sink member.

As a result, heat generated in the semiconductor element can efficiently be transmitted to the second heat sink member via the first heat sink member and can be released more efficiently.

Therefore, a semiconductor device with high thermal stability can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
   a board having an electrode;
   a first heat sink member located over the board;
   a semiconductor element located over the first heat sink member;
   a second heat sink member which covers the semiconductor element and which is thermally connected to the first heat sink member; and
   an insulating member located between the semiconductor element and the second heat sink member, wherein:
   the first heat sink member is configured with an opening in an area corresponding to the electrode of the board;
   the semiconductor element is electrically connected to the electrode through the opening by a bonding wire; and
   the insulating member seals the semiconductor element.

2. The semiconductor device according to claim 1, wherein the board is configured with a heat sink heat release hole in an area over which the semiconductor element is mounted.

3. The semiconductor device according to claim 1, wherein the board and the first heat sink member are configured with corresponding holes in areas over which the semiconductor element is mounted.

4. The semiconductor device according to claim 1, wherein the second heat sink member is configured with a heat release hole.

5. The semiconductor device according to claim 1, wherein the second heat sink member except part thereof is sealed by resin.

6. The semiconductor device according to claim 1, wherein the first heat sink member and the second heat sink member are joined together with a conductive adhesive material therebetween.

7. The semiconductor device according to claim 1, wherein the first heat sink member and the second heat sink member are welded together.

8. The semiconductor device according to claim 5, wherein part of a junction of the first heat sink member and the second heat sink member is not covered with the resin and is exposed.

9. The semiconductor device according to claim 1, wherein an area of the first heat sink member over which the semiconductor element is located is depressed.

10. The semiconductor device according to claim 1, wherein thickness of the first heat sink member is the same as thickness of the second heat sink member.

11. The semiconductor device according to claim 3, wherein a conductive adhesive material is located over the heat sink heat release hole between the board and the first heat sink member.

* * * * *